US011473936B2

(12) United States Patent
Saruki et al.

(10) Patent No.: US 11,473,936 B2
(45) Date of Patent: Oct. 18, 2022

(54) SIGNAL PROCESSING CIRCUIT, POSITION DETECTION DEVICE, AND MAGNETIC SENSOR SYSTEM

(71) Applicant: TDK CORPORATION, Tokyo (JP)

(72) Inventors: Shunji Saruki, Tokyo (JP); Shinichirou Mochizuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 326 days.

(21) Appl. No.: 16/787,455

(22) Filed: Feb. 11, 2020

(65) Prior Publication Data

US 2020/0300668 A1 Sep. 24, 2020

(30) Foreign Application Priority Data

Mar. 18, 2019 (JP) .............................. JP2019-049339

(51) Int. Cl.
| | |
|---|---|
| *G01D 5/16* | (2006.01) |
| *G01D 5/14* | (2006.01) |
| *G06F 3/0354* | (2013.01) |
| *G06F 3/0338* | (2013.01) |
| *G06F 3/038* | (2013.01) |
| *G01R 33/00* | (2006.01) |
| *G01R 33/02* | (2006.01) |
| *G01R 33/09* | (2006.01) |

(52) U.S. Cl.
CPC ............... *G01D 5/16* (2013.01); *G01D 5/142* (2013.01); *G01R 33/0206* (2013.01); *G01R 33/093* (2013.01); *G01R 33/098* (2013.01); *G06F 3/0338* (2013.01); *G06F 3/03549* (2013.01)

(58) Field of Classification Search
CPC .......... G01D 5/16; G01D 5/142; G01D 5/145; G06F 3/0338; G06F 3/03549; G06F 3/0383; G01R 33/0029; G01R 33/0206; G01R 33/093; G01R 33/098
See application file for complete search history.

(56) References Cited

U.S. PATENT DOCUMENTS

| | | | | |
|---|---|---|---|---|
| 2007/0086103 A1* | 4/2007 | Handa | ..................... | G01C 17/38 360/43 |
| 2008/0116886 A1 | 5/2008 | Yamada et al. | | |

(Continued)

FOREIGN PATENT DOCUMENTS

JP 2018-189512 A 11/2018

*Primary Examiner* — Judy Nguyen
*Assistant Examiner* — Joseph O Nyamogo
(74) *Attorney, Agent, or Firm* — Oliff PLC

(57) ABSTRACT

A signal processing circuit processes first to third detection signals output from a magnetic sensor device. The signal processing circuit includes a sphere information generation section that performs first processing and a determination section that performs second processing. With a set of values of the first to third detection signals at a certain timing taken as measurement data and with coordinates that represent the measurement data in an orthogonal coordinate system taken as a measurement point, the first processing includes determining center coordinates of a virtual sphere having a spherical surface approximating the distribution of a plurality of measurement data. The second processing includes determining whether four or more pieces of measurement data are suitable for use in the first processing.

8 Claims, 14 Drawing Sheets

(56) References Cited

U.S. PATENT DOCUMENTS

| | | | |
|---|---|---|---|
| 2009/0212766 A1* | 8/2009 | Olson | G05G 5/05 |
| | | | 324/207.2 |
| 2014/0257731 A1* | 9/2014 | Konda | G01R 33/0029 |
| | | | 702/89 |
| 2016/0084938 A1 | 3/2016 | Doi et al. | |
| 2018/0087927 A1 | 3/2018 | Anagawa et al. | |
| 2018/0106903 A1 | 4/2018 | Iida et al. | |
| 2018/0164127 A1* | 6/2018 | Anagawa | G01D 5/12 |
| 2019/0298202 A1* | 10/2019 | Nakamura | G01R 33/0206 |

* cited by examiner

SIGNAL PROCESSING CIRCUIT, POSITION DETECTION DEVICE, AND MAGNETIC SENSOR SYSTEM

BACKGROUND OF THE INVENTION

1. Field of the Invention

The present invention relates to a signal processing circuit for processing three detection signals, the three detection signals being output from a magnetic sensor device and having correspondences with components in three mutually different directions of a magnetic field applied to the magnetic sensor device, and to a position detection device and a magnetic sensor system each including the signal processing circuit.

2. Description of the Related Art

A magnetic sensor device for detecting components in a plurality of directions of an applied magnetic field has recently been used in a variety of applications. An example of the applications of such a magnetic sensor device is a magnetic position detection device for detecting the position of a three-dimensionally movable magnet, as disclosed in, for example, US 2009/0212766A1 and JP 2018-189512A.

The magnetic position detection device includes, for example, a magnetic sensor device, a magnet movable along a predetermined spherical surface around the magnetic sensor device, and a signal processing circuit. The magnetic sensor device detects three components in three mutually orthogonal directions of a magnetic field generated by the magnet and applied to the magnetic sensor device, and generates three detection signals corresponding to the three components. Based on the three detection signals, the signal processing circuit generates position information indicating the position of the magnet.

Such a magnetic position detection device can cause offsets in the three detection signals and consequently produce inaccurate position information if a disturbance magnetic field other than the magnetic field generated by the magnet is applied to the magnetic sensor device or the positional relationship between the magnetic sensor device and the magnet deviates from a desired one.

Methods for correcting offsets occurring in the three detection signals are known in the art. A typical one of the methods is as follows. With a set of values of the three detection signals at a certain timing taken as measurement data, and with coordinates that represent the measurement data in a three-dimensional orthogonal coordinate system taken as a measurement point, center coordinates of a virtual sphere having a spherical surface approximating the distribution of a plurality of measurement points at a plurality of timings are determined, and the determined center coordinates are used to correct the offsets.

US 2007/0086103A1 describes a magnetic sensor control device including: an input section for inputting a plurality of pieces of magnetic data each containing three components sequentially output from a three-dimensional magnetic sensor; a selection section for selecting four pieces of magnetic data satisfying a predetermined four-point selection condition from among the input plurality of pieces of magnetic data; a calculation section for calculating a center point equally distant from four points corresponding to the selected four pieces of magnetic data; and a setting section for setting the components of the center point as an offset of the magnetic data. US 2007/0086103 A1 also describes the importance of selecting the four points such that the four selected points are distributed evenly over a wide area on a spherical surface passing through the four points. The center point according to US 2007/0086103 A1 corresponds to the center coordinates of the virtual sphere described above.

Now, a description will be given of a problem arising in performing processing for determining the center coordinates of the virtual sphere used for offset correction by the signal processing circuit in the foregoing magnetic position detection device including the magnetic sensor device, the magnet and the signal processing circuit. To determine the center coordinates of the virtual sphere, four or more pieces of measurement data are needed. Hereinafter, a set of four or more pieces of measurement data serving as candidates for the measurement data to be used for determining the center coordinates of the virtual sphere will be referred to as a candidate data set.

For the position detection device, there may be cases where a candidate data set input to the signal processing circuit is unsuitable for determining the center coordinates of the virtual sphere. Examples of the candidate data set unsuitable for determining the center coordinates of the virtual sphere include a set of four or more pieces of measurement data corresponding to four or more measurement points located on a circle or distributed near a circle in the foregoing three-dimensional orthogonal coordinate system. If the candidate data set is a set of four or more pieces of measurement data corresponding to four or more measurement points located on a circle, it is not possible to determine the center coordinates of the virtual sphere by using the candidate data set. If the candidate data set is a set of four or more pieces of measurement data corresponding to four or more measurement points distributed near a circle, the accuracy of the center coordinates of the virtual sphere determined by using the candidate data set can be low. The occurrence of such a problem is significant in, for example, a position detection device applied to a joystick, such as ones described in US 2009/0212766A1 and JP 2018-189512A.

The technique described in US 2007/0086103A1 makes it possible to select four pieces of magnetic data suitable for determining the center point, i.e., the center coordinates of the virtual sphere. Disadvantageously, however, the technique described in US 2007/0086103A1 can sometimes require a long time to obtain four pieces of magnetic data satisfying the four-point selection condition, or can sometimes fail to obtain four pieces of magnetic data satisfying the four-point selection condition within a predetermined period of time.

SUMMARY OF THE INVENTION

It is an object of the present invention to provide a signal processing circuit, a position detection device and a magnetic sensor system that are capable of determining whether a candidate data set given to the signal processing circuit is suitable for determining the center coordinates of a virtual sphere used for offset correction.

A signal processing circuit of the present invention is a circuit for processing a first detection signal, a second detection signal and a third detection signal that have correspondences with components in three mutually different directions of a magnetic field at a reference position. The first to third detection signals are output from a magnetic sensor device that generates the first to third detection signals.

The signal processing circuit of the present invention performs first processing and second processing, with a set of values of the first to third detection signals at a certain timing being taken as measurement data and with coordinates that represent the measurement data in an orthogonal coordinate system that is defined by three axes for expressing the values of the first to third detection signals being taken as a measurement point. The first processing includes determining center coordinates of a virtual sphere having a spherical surface approximating a distribution of a plurality of measurement points at a plurality of timings by using four or more pieces of measurement data obtained at respective different timings.

The second processing includes determining whether a candidate data set is suitable for use in the first processing by using a determination data set, where the candidate data set is a set of four or more pieces of measurement data serving as candidates for the measurement data for use in the first processing, and the determination data set is a set of four or more pieces of measurement data that are all or part of the four or more pieces of measurement data constituting the candidate data set. The determining of whether the candidate data set is suitable for use in the first processing includes determining that the candidate data set is unsuitable for use in the first processing if four or more measurement points corresponding to the four or more pieces of measurement data constituting the determination data set in the orthogonal coordinate system satisfy a predetermined determination criterion indicating that the four or more measurement points are located on a plane or distributed over and in close vicinity of a plane, and otherwise, determining that the candidate data set is suitable for use in the first processing.

The signal processing circuit of the present invention may further perform offset correction processing. The offset correction processing may include correcting an offset of the first to third detection signals to generate first to third corrected signals by using the first to third detection signals and the center coordinates obtained by the first processing.

In the signal processing circuit of the present invention, the second processing may be performed in parallel with the first processing using the candidate data set. In such a case, the first processing may include outputting the determined center coordinates as proper center coordinates only if the candidate data set is determined to be suitable for use in the first processing by the second processing.

In the signal processing circuit of the present invention, the first processing may be performed by using the candidate data set determined to be suitable for use in the first processing by the second processing.

In the signal processing circuit of the present invention, the number of pieces of measurement data constituting the candidate data set may be five or more. In such a case, the number of pieces of measurement data constituting the determination data set may be less than the number of pieces of measurement data constituting the candidate data set. Alternatively, the number of pieces of measurement data constituting the determination data set may be equal to the number of pieces of measurement data constituting the candidate data set.

In the signal processing circuit of the present invention, the second processing may include processing for determining an approximate plane approximating a distribution of the four or more measurement points corresponding to the four or more pieces of measurement data constituting the determination data set in the orthogonal coordinate system by using the least squares method. In such a case, the predetermined determination criterion may be that a residual sum of squares obtained in determining the approximate plane is less than or equal to a predetermined threshold.

In the signal processing circuit of the present invention, the second processing may include processing for determining a first correlation coefficient between a first variable and a second variable, a second correlation coefficient between the second variable and a third variable, and a third correlation coefficient between the first variable and the third variable in the four or more pieces of measurement data constituting the determination data set, where the first variable is the value of the first detection signal, the second variable is the value of the second detection signal, and the third variable is the value of the third detection signal. In such a case, the predetermined determination criterion may be that at least one of the first, second or third correlation coefficient has an absolute value greater than or equal to a predetermined threshold.

In the signal processing circuit of the present invention, the number of pieces of measurement data constituting the determination data set may be four. In such a case, the second processing may include processing for determining a volume of a tetrahedron having four measurement points corresponding to the four pieces of measurement data constituting the determination data set in the orthogonal coordinate system as its four vertexes. The predetermined determination criterion may be that the volume of the tetrahedron is less than or equal to a predetermined threshold.

A position detection device of the present invention includes a magnetic field generator that generates a predetermined magnetic field, a magnetic sensor device, and the signal processing circuit of the present invention. The magnetic field generator is able to change its relative position with respect to the magnetic sensor device along a predetermined spherical surface. The magnetic sensor device generates the first to third detection signals.

A magnetic sensor system of the present invention includes a magnetic sensor device, and the signal processing circuit of the present invention. The magnetic sensor device includes a first magnetic sensor for generating the first detection signal, a second magnetic sensor for generating the second detection signal, and a third magnetic sensor for generating the third detection signal.

According to the signal processing circuit, the position detection device and the magnetic sensor system of the present invention, the second processing performed by the signal processing circuit makes it possible to determine whether the candidate data set given to the signal processing circuit is suitable for determining the center coordinates of the virtual sphere used for offset correction.

Other and further objects, features and advantages of the present invention will appear more fully from the following description.

DETAILED DESCRIPTION OF THE PREFERRED EMBODIMENTS

First Embodiment

Figure 1:
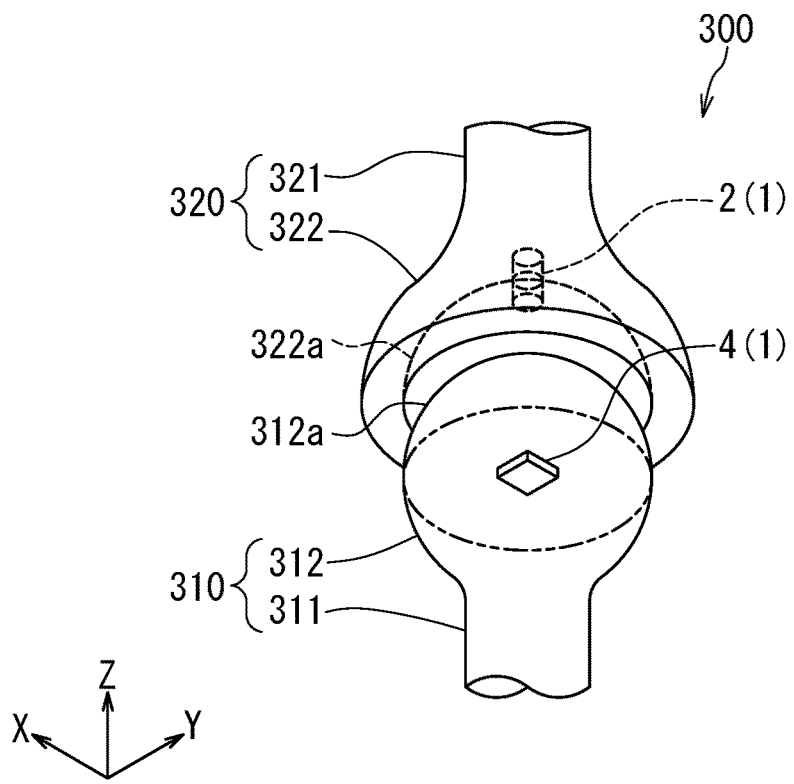
FIG. 1 is a perspective view illustrating a schematic configuration of a joint mechanism including a position detection device according to a first embodiment of the invention.
Figure 2:
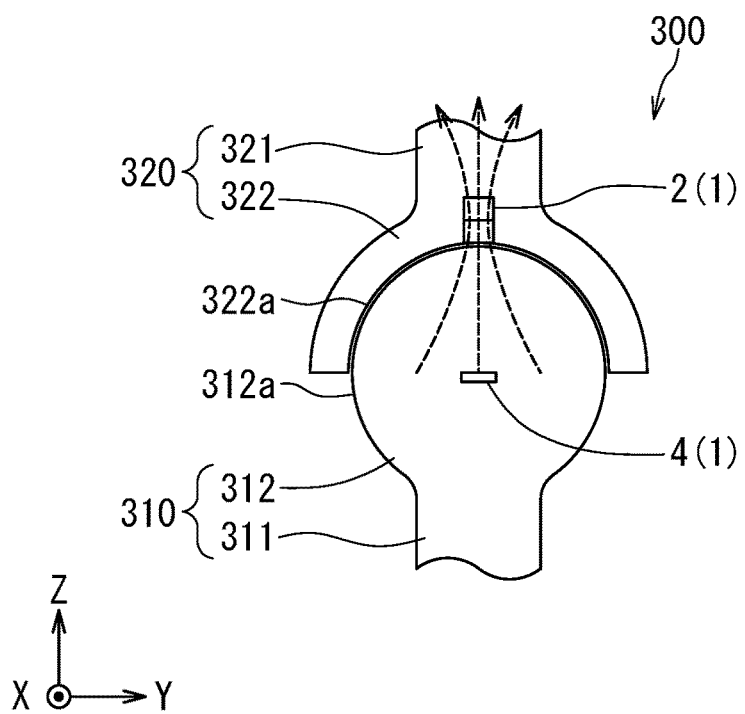
FIG. 2 is a cross-sectional view illustrating the schematic configuration of the joint mechanism illustrated in FIG. 1.
Figure 3:
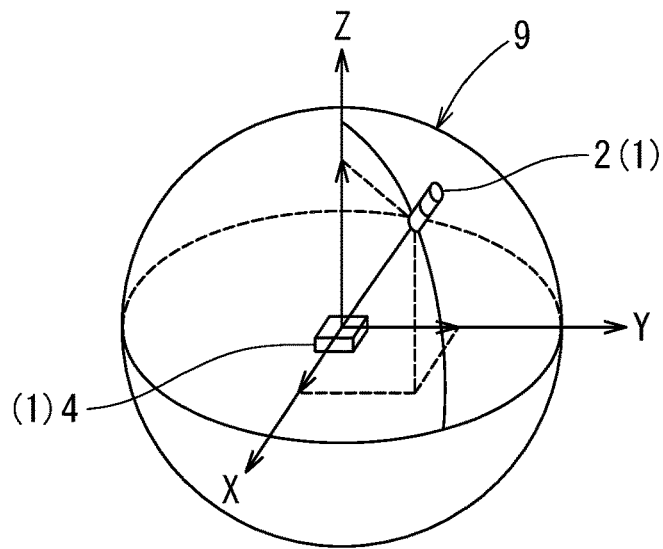
FIG. 3 is an explanatory diagram for describing a reference coordinate system in the position detection device according to the first embodiment of the invention.
Figure 4:
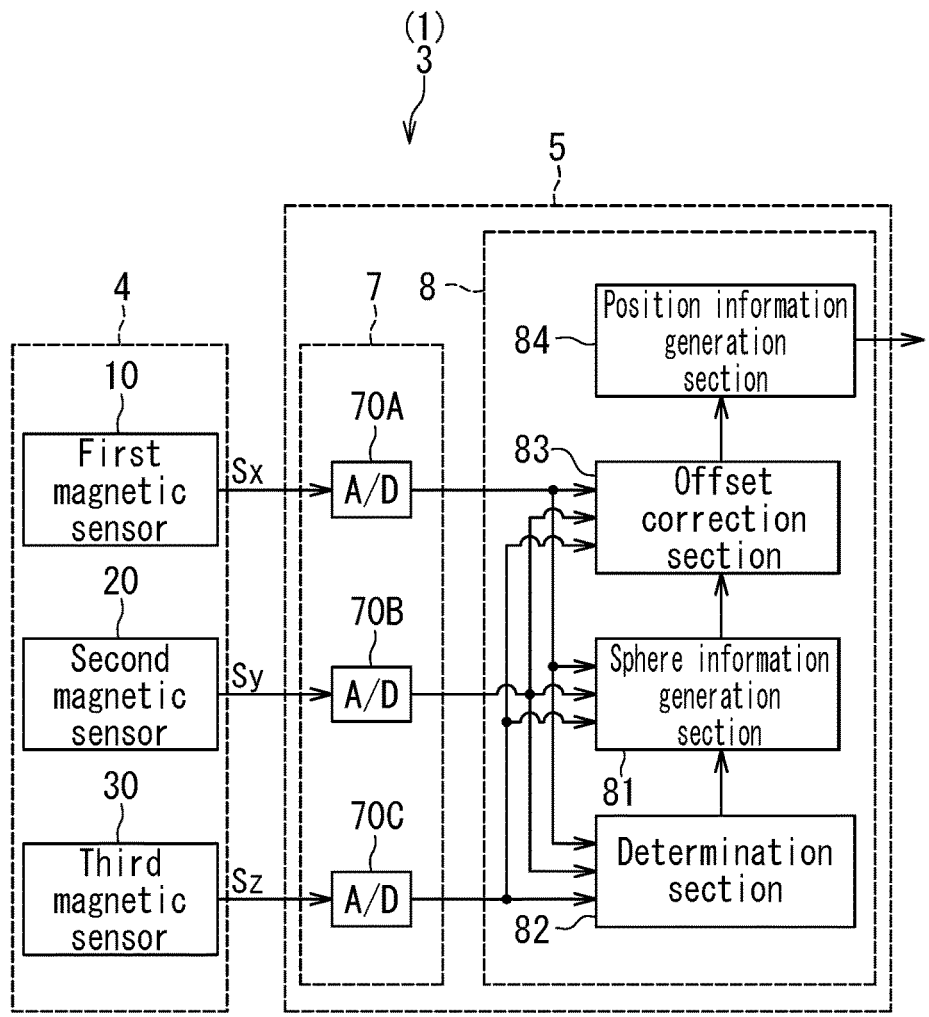
FIG. 4 is a functional block diagram illustrating a configuration of a magnetic sensor system according to the first embodiment of the invention.

Preferred embodiments of the present invention will now be described in detail with reference to the drawings. First, a description will be given of a joint mechanism 300 with a position detection device 1 according to a first embodiment of the invention applied thereto. The joint mechanism 300 is a mechanism including a joint. FIG. 1 is a perspective view illustrating a schematic configuration of the joint mechanism 300. FIG. 2 is a cross-sectional view illustrating the schematic configuration of the joint mechanism 300. FIG. 3 is an explanatory diagram for describing a reference coordinate system in the position detection device 1. FIG. 4 is a functional block diagram illustrating a configuration of a magnetic sensor system according to the present embodiment.

As illustrated in FIGS. 1 and 2, the joint mechanism 300 includes a first member 310, a second member 320, and the position detection device 1.

The first member 310 includes a shaft portion 311 and a spherical portion 312 coupled to one longitudinal end of the shaft portion 311. The spherical portion 312 includes a convex surface 312a. The convex surface 312a is constituted of part of a first spherical surface. A portion of the first spherical surface that is not included in the convex surface 312a is a border portion between the shaft portion 311 and the spherical portion 312.

The second member 320 includes a shaft portion 321 and a receptor portion 322 coupled to one longitudinal end of the shaft portion 321. The receptor portion 322 includes a concave surface 322a. The concave surface 322a is constituted of part of a second spherical surface. The concave surface 322a may be constituted of one half or almost one half of the second spherical surface.

With the spherical portion 312 fitted into the receptor portion 322, the first member 310 and the second member 320 are coupled to each other such that their positional relationship is changeable. The second spherical surface has a radius slightly greater than or equal to that of the first spherical surface. The convex surface 312a and the concave surface 322a may be in contact with each other, or opposed to each other with a lubricant therebetween. The center of the second spherical surface coincides or almost coincides with that of the first spherical surface. The coupling portion between the first and second members 310 and 320 is the joint. In the present embodiment, the joint is a ball-and-socket joint.

The position detection device 1 includes a magnetic field generator 2 and a magnetic sensor device 4. The position detection device 1 further includes a signal processing circuit 5 according to the present embodiment illustrated in FIG. 4. As illustrated in FIG. 4, the magnetic sensor device 4 and the signal processing circuit 5 constitute a magnetic sensor system 3 according to the present embodiment. The positon detection device 1 can thus be said to include the magnetic field generator 2 and the magnetic sensor system 3.

The magnetic field generator 2 is able to change its relative position with respect to the magnetic sensor device 4 along a predetermined spherical surface. The position detection device 1 is a device for detecting the relative position of the magnetic field generator 2 with respect to the magnetic sensor device 4.

The magnetic field generator 2 generates a predetermined magnetic field. An example of the magnetic field generator 2 is a magnet. The magnetic sensor device 4 generates a first detection signal, a second detection signal and a third detection signal that have correspondences with components in three mutually different directions of a magnetic field at a reference position. The reference position will be described in detail later.

The signal processing circuit 5 processes the first to third detection signals and generates position information indicating the relative position of the magnetic field generator 2 with respect to the magnetic sensor device 4.

As illustrated in FIGS. 1 and 2, the magnetic field generator 2 is embedded in the receptor portion 322 so as not to protrude from the concave surface 322a. The magnetic sensor device 4 is located inside the spherical portion 312. Hereinafter, the position of the center of the first spherical surface will be referred to as a reference position. The magnetic sensor device 4 is configured to detect a magnetic field at the reference position.

Hereinafter, a magnetic field that is a portion of the magnetic field generated by the magnetic field generator 2 and that is at the reference position will be referred to as a target magnetic field. For example, the direction of the target magnetic field is parallel to a virtual straight line passing through the reference position and the magnetic field generator 2. In the example illustrated in FIG. 2, the magnetic field generator 2 is a magnet having an N pole and an S pole arranged along the foregoing virtual straight line. The S pole is located closer to the reference position than the N pole is. The plurality of arrowed broken lines in FIG. 2 represent magnetic lines of force corresponding to the magnetic field generated by the magnetic field generator 2.

The joint mechanism 300 illustrated in FIGS. 1 and 2 is able to change the relative position of the second member 320 with respect to the first member 310, with the spherical portion 312 fitted into the receptor portion 322. This allows the magnetic field generator 2 to be able to change its relative position with respect to the magnetic sensor device 4 along the foregoing predetermined spherical surface. In the present embodiment, the relative position of the magnetic field generator 2 with respect to the magnetic sensor device 4 is represented by the position of a point closest to the reference position on the magnetic field generator 2. The center of the predetermined spherical surface coincides or almost coincides with the center of the first spherical surface. The predetermined spherical surface has a radius greater than or equal to that of the first spherical surface. The radius of the predetermined spherical surface may coincide with that of the first spherical surface or that of the second spherical surface.

Now, a description will be given of a reference coordinate system in the present embodiment with reference to FIG. 3. The reference coordinate system is an orthogonal coordinate system that is set with reference to the magnetic sensor device 4 and defined by three axes for expressing the values of the first to third detection signals. An X direction, a Y direction, and a Z direction are defined in the reference coordinate system. As illustrated in FIG. 3, the X, Y, and X directions are orthogonal to each other. The opposite directions to the X, Y, and Z directions will be expressed as –X, –Y, and –Z directions, respectively.

As described above, the magnetic sensor device 4 generates the first, second, and third detection signals having correspondences with the components in three mutually different directions of the magnetic field at the reference position. In the present embodiment, specifically, the three mutually different directions are a direction parallel to the X direction, a direction parallel to the Y direction, and a direction parallel to the Z direction. The three axes defining the reference coordinate system are an axis parallel to the X direction, an axis parallel to the Y direction, and an axis parallel to the Z direction.

The position of the magnetic sensor device 4 in the reference coordinate system remains unchanged. As the relative position of the magnetic field generator 2 with respect to the magnetic sensor device 4 changes, the position of the magnetic field generator 2 in the reference coordinate system changes along the foregoing predetermined spherical surface. In FIG. 3, the reference numeral 9 designates the predetermined spherical surface. The position of the magnetic field generator 2 in the reference coordinate system indicates the relative position of the magnetic field generator 2 with respect to the magnetic sensor device 4. Hereinafter, the position of the magnetic field generator 2 in the reference coordinate system will be simply referred to as the position of the magnetic field generator 2. An XY plane including the reference position will be referred to as a reference plane.

In the joint mechanism 300 including the position detection device 1, the position detection device 1 detects the relative position of the magnetic field generator 2 with respect to the magnetic sensor device 4, thereby enabling detection of the relative position of the second member 320 with respect to the first member 310. The joint mechanism 300 is used for robots, industrial equipment, medical equipment, amusement equipment, etc.

The position detection device 1 is applicable not only to the joint mechanism 300 but also to joysticks and trackballs.

A joystick includes, for example, a lever and a supporter that swingably supports the lever. In the case of applying the position detection device 1 to the joystick, for example, the magnetic field generator 2 is provided inside the supporter and the magnetic sensor device 4 is provided inside the lever so that the relative position of the magnetic field generator 2 with respect to the magnetic sensor device 4 changes along a predetermined spherical surface as the lever swings.

A trackball includes, for example, a ball and a supporter that rotatably supports the ball. In the case of applying the position detection device 1 to the trackball, for example, the magnetic field generator 2 is provided inside the supporter and the magnetic sensor device 4 is provided inside the ball so that the relative position of the magnetic field generator 2 with respect to the magnetic sensor device 4 changes along a predetermined spherical surface as the ball rotates.

Reference is now made to FIG. 4 to describe a configuration of the magnetic sensor device 4 and the signal processing circuit 5. The magnetic sensor device 4 generates the first detection signal Sx, the second detection signal Sy and the third detection signal Sz having correspondences with components in three mutually different directions of the target magnetic field. In the present embodiment, the first detection signal Sx has a correspondence with a first component of the target magnetic field. The first component is a component in a first sensing direction. The second detection signal Sy has a correspondence with a second component of the target magnetic field. The second component is a component in a second sensing direction. The third detection signal Sz has a correspondence with a third component of the target magnetic field. The third component is a component in a third sensing direction.

In the present embodiment, the magnetic sensor device 4 includes a first magnetic sensor 10 for generating the first detection signal Sx, a second magnetic sensor 20 for generating the second detection signal Sy, and a third magnetic sensor 30 for generating the third detection signal Sz. Each of the first to third magnetic sensors 10, 20 and 30 includes at least one magnetic detection element.

The signal processing circuit 5 includes a first processor 7 and a second processor 8. In the present embodiment, hardware that constitutes the first processor 7 is different from that constituting the second processor 8. For example, the first processor 7 is constructed of an application-specific integrated circuit (ASIC). For example, the second processor 8 is constructed of a microcomputer.

Next, a configuration of the magnetic sensor device 4 and the first processor 7 will be described. In the present embodiment, the magnetic sensor device 4 is configured as a first chip. The first processor 7 is configured as a second chip different from the first chip. The first processor 7 may be integrated with the magnetic sensor device 4. The second processor 8 may be separate from the magnetic sensor device 4 and the first processor 7. In the present embodiment, an integral unit of the magnetic sensor device 4 and the first processor 7 will be referred to as a magnetic sensor assembly 200.

Figure 5:
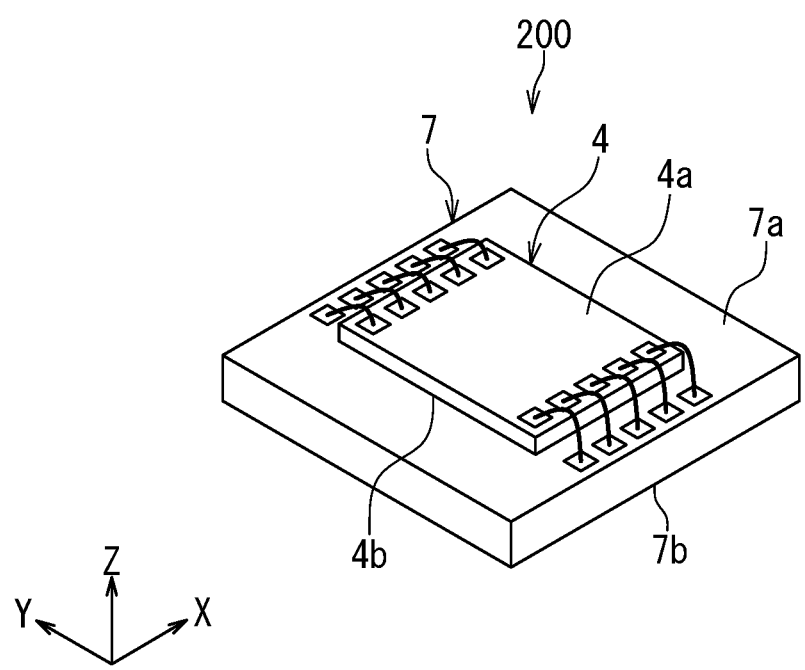
FIG. 5 is a perspective view illustrating a magnetic sensor assembly of the first embodiment of the invention.

FIG. 5 is a perspective view of the magnetic sensor assembly 200. As illustrated in FIG. 5, both the magnetic sensor device 4 and the first processor 7 have a rectangular parallelepiped shape. The magnetic sensor device 4 and the first processor 7 have their respective outer surfaces.

The outer surfaces of the magnetic sensor device 4 include a top surface 4a and a bottom surface 4b opposite to each other, and four side surfaces connecting the top surface 4a and the bottom surface 4b. The outer surfaces of the first processor 7 include a top surface 7a and a bottom surface 7b opposite to each other, and four side surfaces connecting the top surface 7a and the bottom surface 7b. The magnetic sensor device 4 is mounted on the top surface 7a of the first processor 7 in such an orientation that the bottom surface 4b faces the top surface 7a.

The magnetic sensor device 4 has a group of terminals provided on the top surface 4a. The first processor 7 has a group of terminals provided on the top surface 7a. The group of terminals of the magnetic sensor device 4 is connected to the group of terminals of the first processor 7 via a plurality of bonding wires, for example.

Figure 6:
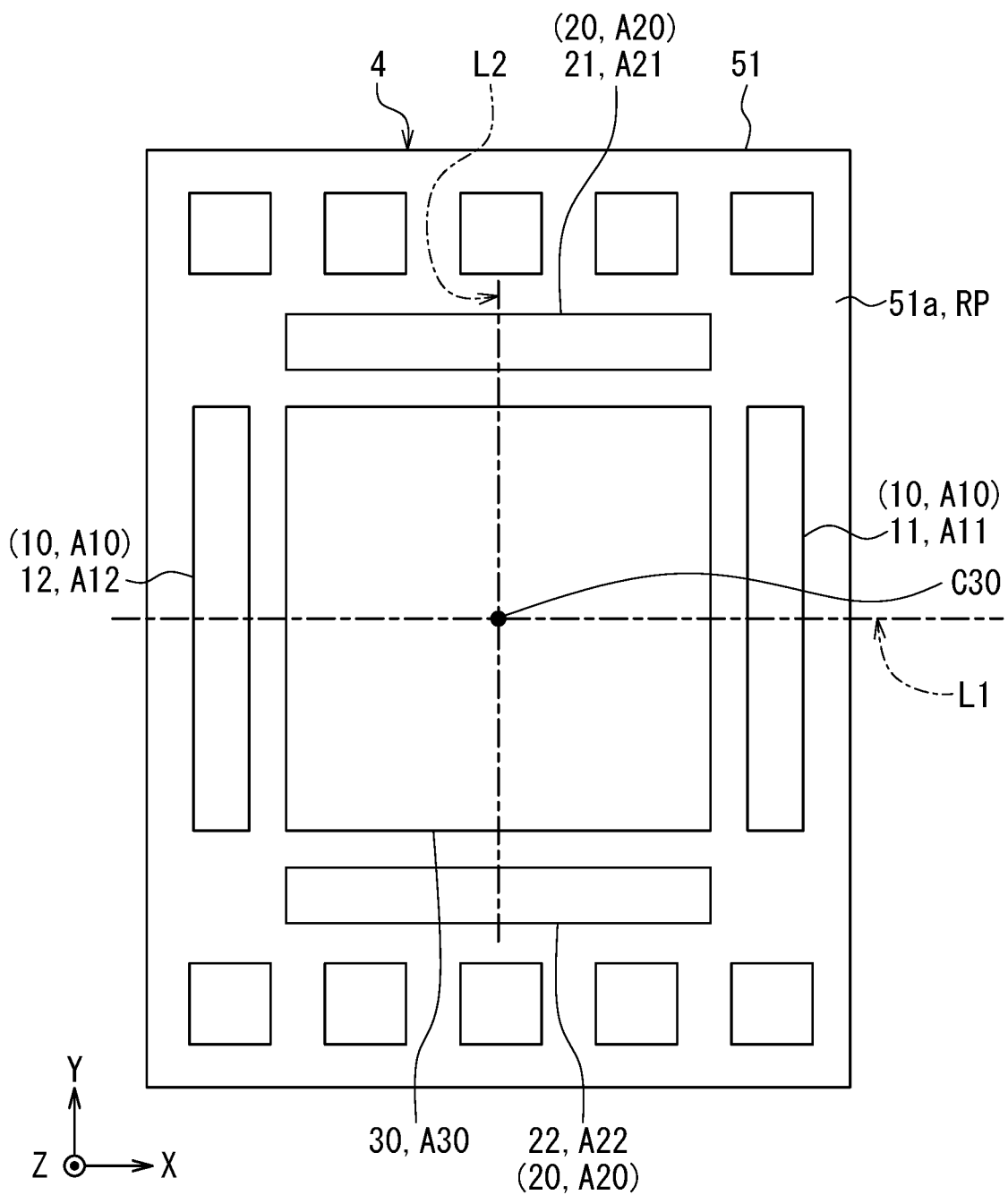
FIG. 6 is a plan view illustrating a magnetic sensor device of the first embodiment of the invention.
Figure 12:
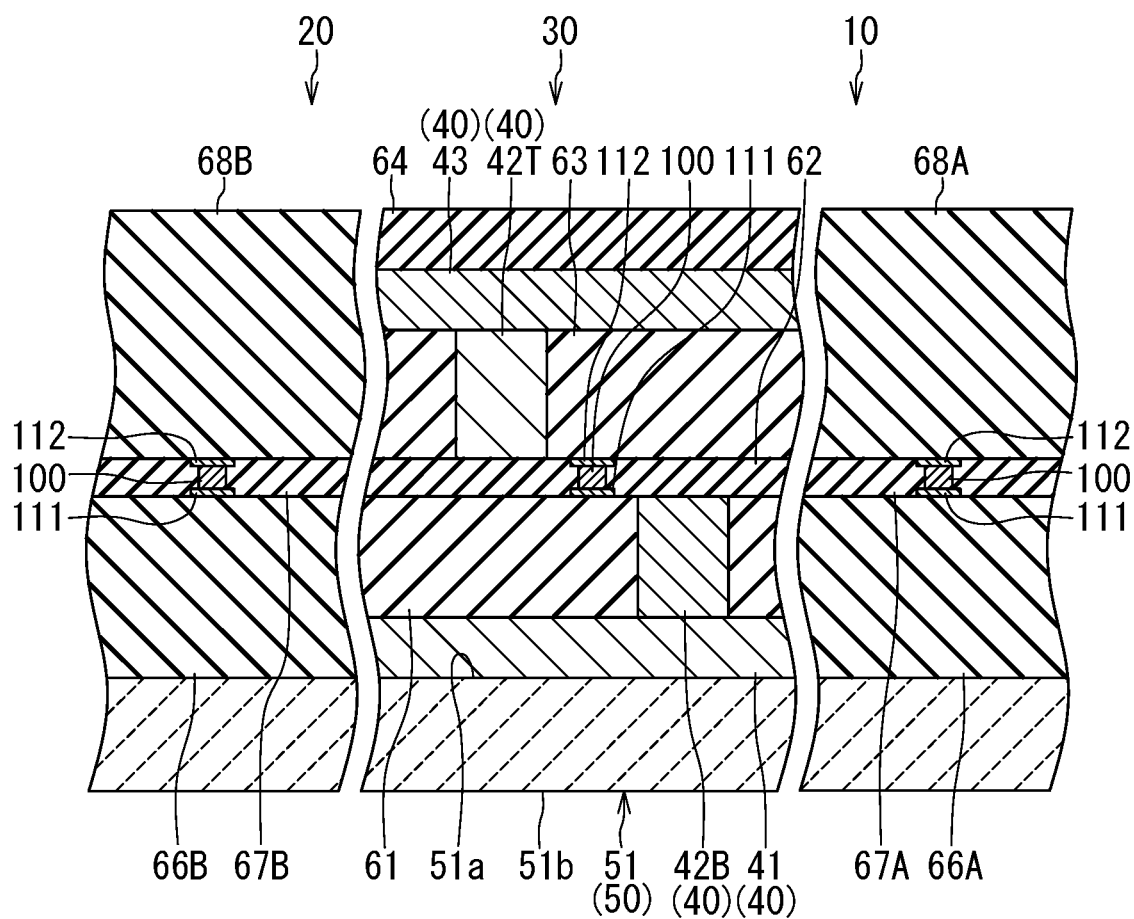
FIG. 12 is a cross-sectional view illustrating respective portions of first to third magnetic sensors and a soft magnetic structure of the first embodiment of the invention.

Next, the layout of the first to third magnetic sensors 10, 20 and 30 will be described with reference to FIG. 6. FIG. 6 is a plan view of the magnetic sensor device 4. As illustrated in FIG. 6, the magnetic sensor device 4 includes the first to third magnetic sensors 10, 20 and 30, a substrate 51 supporting the first to third magnetic sensors 10, 20 and 30, and the group of terminals. The substrate 51 has a top surface 51a and a bottom surface 51b. The bottom surface 51b is illustrated in FIG. 12 to be described later.

Now, a relationship of the components of the magnetic sensor device 4 with the reference coordinate system and the reference plane will be described with reference to FIG. 6. As described above, the X, Y, Z, −X, −Y, and −Z directions are defined in the reference coordinate system. The X and Y directions are parallel to the top surface 51a of the substrate 51. The Z direction is perpendicular to the top surface 51a of the substrate 51, and directed from the bottom surface 51b to the top surface 51a of the substrate 51. Hereinafter, the term "above" refers to positions located forward of a reference position in the Z direction, and "below" refers to positions opposite from the "above" positions with respect to the reference position. For each component of the magnetic sensor device 4, the term "top surface" refers to a surface of the component lying at the end thereof in the Z direction, and "bottom surface" refers to a surface of the component lying at the end thereof in the −Z direction.

In the present embodiment, the top surface 51a of the substrate 51 is the reference plane. Hereinafter, the reference plane will be denoted by the symbol RP. The reference plane RP includes three different areas: a first area A10; a second area A20; and a third area A30. The first area A10 is an area formed by vertically projecting the first magnetic sensor 10 onto the reference plane RP. The second area A20 is an area formed by vertically projecting the second magnetic sensor 20 onto the reference plane RP. The third area A30 is an area formed by vertically projecting the third magnetic sensor 30 onto the reference plane RP.

Here, two mutually orthogonal straight lines that are located in the reference plane RP, pass through the centroid C30 of the third area A30 and are perpendicular to the Z direction will be referred to as a first straight line L1 and a second straight line L2. In the present embodiment, specifically, the first straight line L1 is parallel to the X direction, and the second straight line L is parallel to the Y direction.

In the present embodiment, the first magnetic sensor 10 includes a first portion 11 and a second portion 12 located at different positions from each other in the X direction. The first area A10 includes a first partial area A11 formed by vertically projecting the first portion of the first magnetic sensor 10 onto the reference plane RP, and a second partial area A12 formed by vertically projecting the second portion 12 of the first magnetic sensor 10 onto the reference plane RP. The first and second partial areas A11 and A12 are located on opposite sides of the third area A30 in a direction parallel to the first straight line L1.

The second magnetic sensor 20 includes a first portion 21 and a second portion 22 located at different positions from each other in the Y direction. The second area A20 includes a third partial area A21 formed by vertically projecting the first portion 21 of the second magnetic sensor 20 onto the reference plane RP, and a fourth partial area A22 formed by vertically projecting the second portion 22 of the second magnetic sensor 20 onto the reference plane RP. The third and fourth partial areas A21 and A22 are located on opposite sides of the third area A30 in a direction parallel to the second straight line L2.

In the present embodiment, both the first and second partial areas A11 and A12 are located to be intersected by the first straight line L1. Both the third and fourth partial areas A21 and A22 are located to be intersected by the second straight line L2.

It is desirable that no portion of the first area A10 be intersected by the second straight line L2. Likewise, it is desirable that no portion of the second area A20 be intersected by the first straight line L1.

In the present embodiment, in particular, the first area A10 and the second area A20 as viewed from above have such a positional relationship that the first area A10 coincides with the second area A20 if the first area A10 is rotated 90° around the centroid C30 of the third area A30. In FIG. 6, if the first and second partial areas A11 and A12 are rotated 90° counterclockwise around the centroid C30, the first and second partial areas A11 and A12 coincide with the third and fourth partial areas A21 and A22, respectively.

Figure 7:
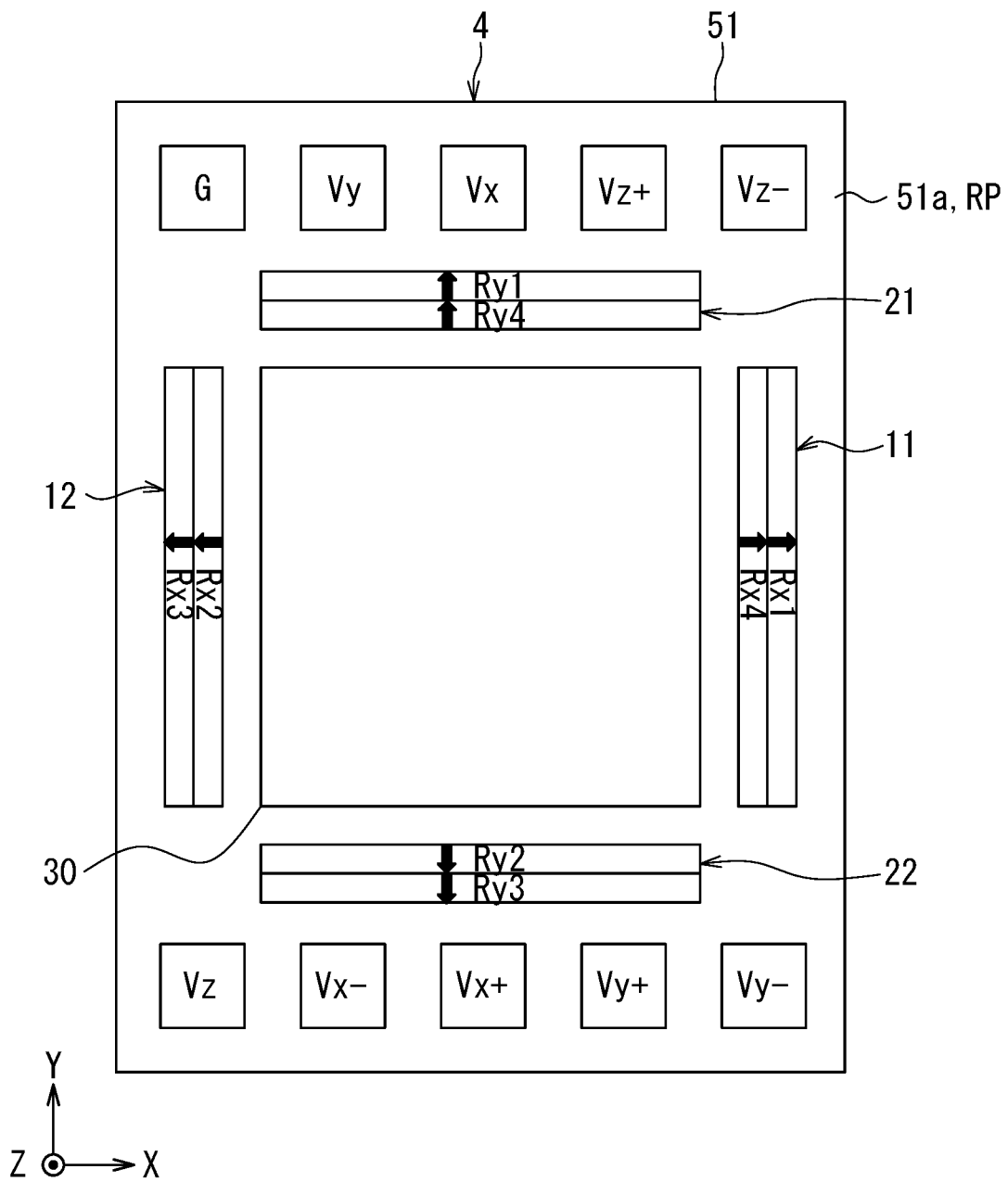
FIG. 7 is an explanatory diagram illustrating a configuration of the magnetic sensor device of the first embodiment of the invention.
Figure 8:
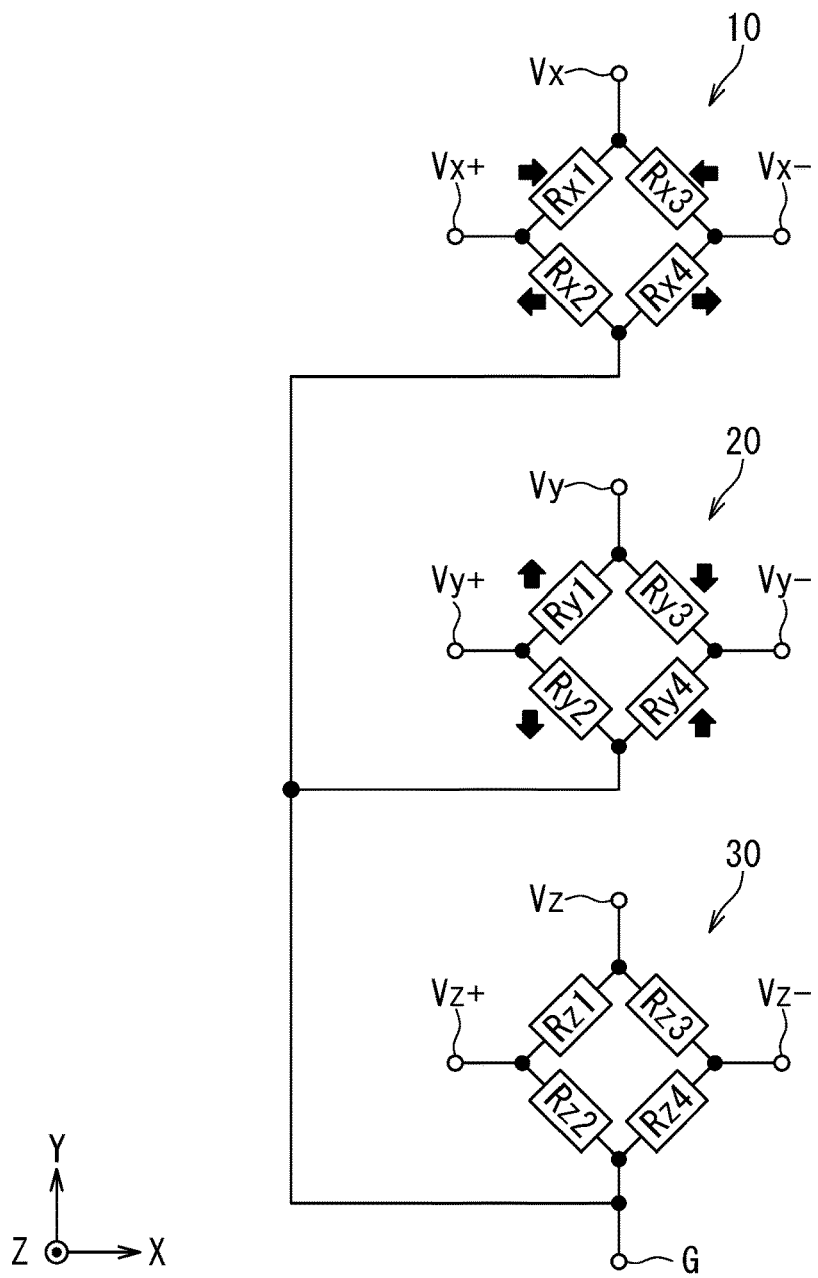
FIG. 8 is a circuit diagram illustrating an example of a circuit configuration of the magnetic sensor device of the first embodiment of the invention.

An example configuration of the magnetic sensor device 4 will now be described with reference to FIG. 7 and FIG. 8. FIG. 7 is an explanatory diagram illustrating the configuration of the magnetic sensor device 4. FIG. 8 is a circuit diagram illustrating an example of a circuit configuration of the magnetic sensor device 4.

As described above, the first magnetic sensor 10 generates the first detection signal Sx having a correspondence with the first component, i.e., a component in the first sensing direction, of the target magnetic field. The second magnetic sensor 20 generates the second detection signal Sy having a correspondence with the second component, i.e., a component in the second sensing direction, of the target magnetic field. The third magnetic sensor 30 generates the third detection signal Sz having a correspondence with the third component, i.e., a component in the third sensing direction, of the target magnetic field.

In the present embodiment, specifically, the first sensing direction is a direction parallel to the X direction. The first sensing direction includes the X direction and the −X direction. The second sensing direction is a direction parallel to the Y direction. The second sensing direction includes the Y direction and the −Y direction. The third sensing direction is a direction parallel to the Z direction. The third sensing direction includes the Z direction and the −Z direction.

As illustrated in FIG. 7, the group of terminals of the magnetic sensor device 4 includes: a power supply terminal Vx and output terminals Vx+ and Vx− associated with the first magnetic sensor 10; a power supply terminal Vy and output terminals Vy+ and Vy− associated with the second magnetic sensor 20; a power supply terminal Vz and output terminals Vz+ and Vz− associated with the third magnetic sensor 30; and a ground terminal G shared among the first to third magnetic sensors 10, 20 and 30.

In the example illustrated in FIG. 8, the first magnetic sensor 10 includes four resistor sections Rx1, Rx2, Rx3 and Rx4 constituting a Wheatstone bridge circuit. Each of the resistor sections Rx1, Rx2, Rx3 and Rx4 has a resistance that varies depending on the first component of the target magnetic field. The resistor section Rx1 is provided between the power supply terminal Vx and the output terminal Vx+. The resistor section Rx2 is provided between the output terminal Vx+ and the ground terminal G. The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3 and Ry4 constituting a Wheatstone bridge circuit. Each of the resistor sections Ry1, Ry2, Ry3 and Ry4 has a resistance that varies depending on the second component of the target magnetic field. The resistor section Ry1 is provided between the power supply terminal Vy and the output terminal Vy+. The resistor section Ry2 is provided between the output terminal Vy+ and the ground terminal G The resistor section Ry3 is provided between the power supply terminal Vy and the output terminal Vy−. The resistor section Ry4 is provided between the output terminal Vy− and the ground terminal G.

The third magnetic sensor 30 includes four resistor sections Rz1, Rz2, Rz3 and Rz4 constituting a Wheatstone bridge circuit. Each of the resistor sections Rz1, Rz2, Rz3 and Rz4 has a resistance that varies depending on an output magnetic field component output from a magnetic field conversion section, which will be described later. The resistor section Rz1 is provided between the power supply terminal Vz and the output terminal Vz+. The resistor section Rz2 is provided between the output terminal Vz+ and the ground terminal G The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 8, the filled arrows indicate the magnetization directions of the magnetization pinned layers of the MR elements. In the example illustrated in FIG. 8, the magnetization pinned layers of the MR elements in each of the resistor sections Rx1 and Rx4 are magnetized in the X direction. The magnetization pinned layers of the MR elements in each of the resistor sections Rx2 and Rx3 are magnetized in the −X direction.

The magnetization pinned layers of the MR elements in each of the resistor sections Ry1 and Ry4 are magnetized in the Y direction. The magnetization pinned layers of the MR elements in each of the resistor sections Ry2 and Ry are magnetized in the −Y direction. The magnetization directions of the magnetization pinned layers of the MR elements in each of the resistor sections Rz1, Rz2, Rz3 and Rz4 will be described later.

A potential difference between the output terminals Vx+ and Vx− has a correspondence with the first component of the target magnetic field. The first magnetic sensor 10 generates the first detection signal Sx corresponding to the potential difference between the output terminals Vx+ and Vx−. The first detection signal Sx may be one obtained by adjusting the amplitude or offset of the potential difference between the output terminals Vx+ and Vx−.

A potential difference between the output terminals Vy+ and Vy− has a correspondence with the second component of the target magnetic field. The second magnetic sensor 20 generates the second detection signal Sy corresponding to the potential difference between the output terminals Vy+ and Vy−. The second detection signal Sy may be one obtained by adjusting the amplitude or offset of the potential difference between the output terminals Vy+ and Vy−.

A potential difference between the output terminals Vz+ and Vz− has a correspondence with the third component of the target magnetic field. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 7 to describe an example layout of the resistor sections Rx1, Rx2, Rx3, Rx4, Ry1, Ry2, Ry3, and Ry4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor 20 includes the resistor sections Ry2 and Ry3.

In FIG. 7, the filled arrows indicate the magnetization directions of the magnetization pinned layers of the MR elements. In the example illustrated in FIG. 7, in each of the first portion 11 of the first magnetic sensor 10, the second portion 12 of the first magnetic sensor 10, the first portion 21 of the second magnetic sensor 20, and the second portion 22 of the second magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 9. An MR element 100 illustrated in FIG. 9 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 9:
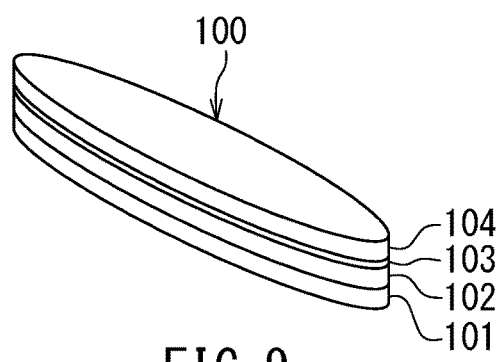
FIG. 9 is a perspective view illustrating a magnetoresistive element of the first embodiment of the invention.

The layers 101 to 104 of the MR element 100 may be stacked in the reverse order to that illustrated in FIG. 9. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 10:
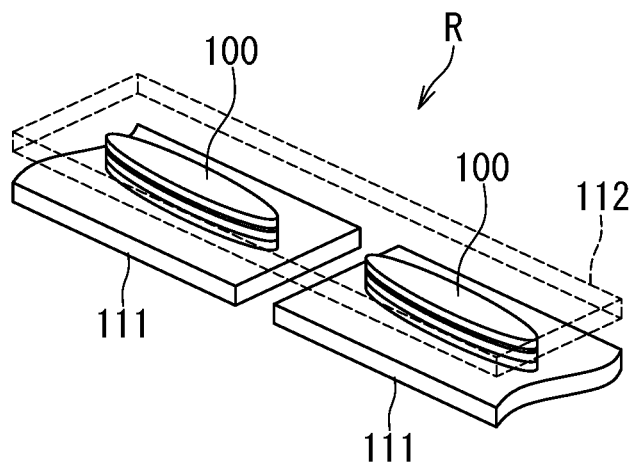
FIG. 10 is a perspective view illustrating part of a resistor section of the first embodiment of the invention.

Next, an example configuration of the resistor section R will be described with reference to FIG. 10. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example illustrated in FIG. 10 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the third magnetic sensor 30 will be described with reference to FIG. 11. The third magnetic sensor 30 includes a soft magnetic structure 40 formed of a soft magnetic material, in addition to the resistor sections Rz1, Rz2, Rz3 and Rz4. The soft magnetic structure 40 includes a magnetic field conversion section 42 and at least one soft magnetic layer. The magnetic field conversion section 42 receives the third component of the target magnetic field and outputs an output magnetic field component that is in a direction perpendicular to the third sensing direction. The strength of the output magnetic field component has a correspondence with the strength of the third component of the target magnetic field. The third magnetic sensor 30 detects the strength of the third component of the target magnetic field by detecting the strength of the output magnetic field component.

Figure 11:
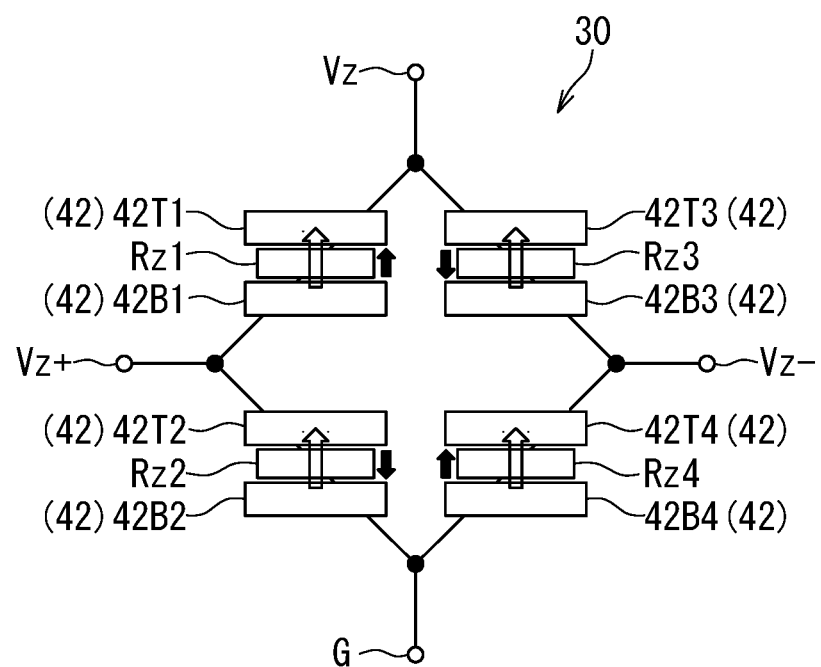
FIG. 11 is an explanatory diagram illustrating configurations of a magnetic field conversion section and a third magnetic sensor of the first embodiment of the invention.

In the example illustrated in FIG. 11, the magnetic field conversion section 42 includes: a lower yoke 42B1 and an upper yoke 421 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component output by the magnetic field conversion section 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 11, the four hollow arrows indicate the direction of the magnetic field components applied to the resistor sections Rz1, Rz2, Rz3 and Rz4 when the third component of the target magnetic field is in the Z direction. On the other hand, in FIG. 11 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the third component of the target magnetic field is in the Z direction. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the third component of the target magnetic field is in the Z direction.

Now, the function of the third magnetic sensor 30 will be described. When there is no third component of the target magnetic field, the magnetization direction of the free layer 104 of each MR element 100 in the resistor sections Rz1, Rz2, Rz3 and Rz4 is perpendicular to the magnetization direction of the magnetization pinned layer 102.

If the third component of the target magnetic field is in the Z direction, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no third component of the target magnetic field.

In contrast to this, if the third component of the target magnetic field is in the −Z direction, the resistor sections Rz1 and Rz4 increase in resistance while the resistor sections Rz2 and Rz3 decrease in resistance, compared to when there is no third component of the target magnetic field.

The amount of change in the resistance of each of the resistor sections Rz1, Rz2, Rz3 and Rz4 depends on the strength of the third component of the target magnetic field.

Changes in the direction and strength of the third component of the target magnetic field cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the third component of the target magnetic field based on the potential difference. The third magnetic sensor 30 generates the third detection signal Sz corresponding to the potential difference between the output terminals Vz+ and Vz−. The third detection signal Sz may be one obtained by adjusting the amplitude or offset of the potential difference between the output terminals Vz+ and Vz−.

Reference is now made to FIG. 12 to describe an example structure of the first to third magnetic sensors 10, 20 and 30. FIG. 12 shows a portion of each of the first to third magnetic sensors 10, 20 and 30. In this example, the first to third magnetic sensors 10, 20 and 30 are disposed on the substrate 51. The substrate 51 has the top surface 51a and the bottom surface 51b.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are arranged on the insulating layer 66A. FIG. 12 shows one of the plurality of MR elements 100 included in the resistor sections Rx1, Rx2, Rx3 and Rx4, and also the upper connection layer 112 and the lower connection layer 111 connected to the MR element 100. The insulating layer 67A lies on the top surface of the insulating layer 66A and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 is structurally similar to the first magnetic sensor 10. More specifically, the second magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are arranged on the insulating layer 66B. FIG. 12 shows one of the plurality of MR elements 100 included in the resistor sections Ry1, Ry2, Ry3 and Ry4, and also the upper connection layer 112 and the lower connection layer 111 connected to the MR element 100. The insulating layer 67B lies on the top surface of the insulating layer 66B and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4 and the soft magnetic structure 40. In the example illustrated in FIG. 12, the soft magnetic structure 40 includes the magnetic field conversion section 42 and two soft magnetic layers 41 and 43.

The magnetic field conversion section 42 includes the lower yokes 42B1, 42B2, 42B3 and 42B4 and the upper yokes 42T1, 42T2, 42T3 and 42T4 illustrated in FIG. 11. In FIG. 12, one of the lower yokes 42B1, 42B2, 42B3 and 42B4 is denoted by the reference symbol 42B, and a corresponding one of the upper yokes 42T1, 42T2, 42T3 and 42T4 is denoted by the reference symbol 42T.

The soft magnetic layer 41 lies on the top surface 51a of the substrate 51. The lower yokes 42B1, 42B2, 42B3 and 42B4 are arranged on the soft magnetic layer 41. The insulating layer 61 lies on the soft magnetic layer 41 and surrounds the lower yokes 42B1, 42B2, 42B3 and 42B.

The resistor sections Rz1, Rz2, Rz3 and Rz4 are arranged on the insulating layer 61. FIG. 12 shows one of the plurality of MR elements 100 included in the resistor sections Rz1, Rz2, Rz3 and Rz4, and also the upper connection layer 112 and the lower connection layer 111 connected to the MR element 100. The insulating layer 62 lies on the lower yokes 42B1, 42B2, 42B3 and 42B and the insulating layer 61, and surrounds the resistor sections Rz1, Rz2, Rz3 and Rz4.

The upper yokes 42T1, 42T2, 42T3 and 42T4 are arranged on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 extend across the entire area or almost the entire area of the third magnetic sensor 30. In other words, both of an area formed by vertically projecting the soft magnetic layer 41 onto the reference plane RP and an area formed by vertically projecting the soft magnetic layer 43 onto the reference plane RP coincide with or almost coincide with the third area A30.

In the example illustrated in FIG. 12, all the magnetic detection elements or MR elements 100 included in the first to third magnetic sensors 10, 20 and 30 are located at the same distance from the top surface 51a of the substrate 51, i.e., the reference plane RP.

The magnetic field conversion section 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

Next, details of processing performed by the signal processing circuit 5 and a configuration of the signal processing circuit 5 will be described with reference to FIG. 4. The signal processing circuit 5 performs first processing, second processing, offset correction processing, and position information generation processing. As described above, the signal processing circuit 5 includes the first processor 7 and the second processor 8. The first processor 7 includes analog-to-digital converters (hereinafter, referred to as A/D converters) 70A, 70B and 70C. The second processor 8 includes a sphere information generation section 81 that performs the first processing, a determination section 82 that performs the second processing, an offset correction section 83 that performs the offset correction processing, and a position information generation section 84 that performs the position information generation processing. The sphere information generation section 81, the determination section 82, the offset correction section 83, and the position information generation section 84 are functional blocks for performing the respective processing described above.

The A/D converters 70A, 70B, and 70C convert the first, second, and third detection signals Sx, Sy, and Sz into digital form, respectively. The first to third detection signals Sx, Sy, and Sz converted into digital form are input to the sphere information generation section 81, the determination section 82, and the offset correction section 83.

The first processing, the second processing, the offset correction processing, and the position information generation processing are each repeated during use of the position detection device 1.

Here, a set of values of the first to third detection signals Sx, Sy, and Sz at a certain timing is taken as measurement data, and coordinates (Sx, Sy, Sz) representing the measurement data in the foregoing reference coordinate system are taken as a measurement point. As described above, a change in the relative position of the magnetic field generator 2 with respect to the magnetic sensor device 4 causes the position of the magnetic field generator 2 in the reference coordinate system to change along a predetermined spherical surface. Accordingly, if a plurality of measurement points at a plurality of timings are obtained and plotted on the reference coordinate system, the distribution of the plurality of measurement points can be approximated by a spherical surface. In the present embodiment, the spherical surface approximating the distribution of the plurality of measurement points will be referred to as an approximate spherical surface. The plurality of measurement points are distributed over the approximate spherical surface or near the approximate spherical surface.

The first processing by the sphere information generation section 81 includes determining center coordinates of a virtual sphere having the approximate spherical surface by using four or more pieces of measurement data obtained at respective different timings. Hereinafter, a set of four or more pieces of measurement data serving as candidates for the measurement data for use in the first processing will be referred to as a candidate data set. The first processing can be said to be performed by using the candidate data set.

The first processing may further include determining the radius of the virtual sphere by using the candidate data set. Information including data on the center coordinates and radius of the virtual sphere will hereinafter be referred to as sphere information. For example, the center coordinates and radius of the virtual sphere may be determined by determining an approximate spherical surface including four measurement points using four pieces of measurement data and an equation of a spherical surface. Alternatively, the center coordinates and radius of the virtual sphere may be determined by determining an approximate spherical surface closest to five or more measurement points using five or more pieces of measurement data, the equation of the spherical surface, and the least squares method.

The second processing by the determination section 82 includes determining whether the candidate data set is suitable for use in the first processing by using four or more pieces of measurement data that are all or part of the four or more pieces of measurement data constituting the candidate data set. Hereinafter, a set of four or more pieces of measurement data used in the second processing will be referred to as a determination data set. The second processing can be said to be performed by using the determination data set.

In the present embodiment, the second processing is performed in parallel with the first processing using the candidate data set. In the first processing, the processing for determining the center coordinates of the virtual sphere by using the candidate data set is started regardless of whether the candidate data set is suitable for use in the first processing. In the present embodiment, the second processing is completed in a shorter time than the first processing is. The determination by the second processing is thus completed before the center coordinates of the virtual sphere are determined by the first processing. Center coordinates determined by the first processing are proper ones if determined by using a candidate data set that is determined to be suitable for use in the first processing. The first processing includes storing proper center coordinates, and updating the stored proper center coordinates each time new proper center coordinates are obtained.

If the determination section 82 determines that the candidate data set is unsuitable for use in the first processing, the determination section 82 outputs an abort command to the sphere information generation section 81. If the determination section 82 determines that the candidate data set is suitable for use in the first processing, the determination section 82 does not output the abort command.

If the abort command is received, the sphere information generation section 81 aborts the first processing. If no abort command is received before the center coordinates of the virtual sphere are determined, the sphere information generation section 81 stores the determined center coordinates as proper center coordinates. The sphere information generation section 81 outputs the stored proper center coordinates to the offset correction section 83. In such a manner, in the first processing the determined center coordinates are output to the offset correction section 83 as proper center coordinates only if the candidate data set is determined to be suitable for use in the first processing by the second processing. In the present embodiment, the center coordinates stored and output by the sphere information generation section 81 and the first processing are proper center coordinates.

In both of the case where the first processing is aborted and the case where the proper center coordinates are updated, the sphere information generation section 81 starts the processing for determining the center coordinates of the virtual sphere by using a new candidate data set immediately or at a predetermined timing.

The number of pieces of measurement data constituting the candidate data set may be five or more. In such a case, the number of pieces of measurement data constituting the determination data set may be less than the number of pieces of measurement data constituting the candidate data set, or equal to the number of pieces of measurement data constituting the candidate data set. If the number of pieces of measurement data constituting the candidate data set is four, the number of pieces of measurement data constituting the determination data set is equal to the number of pieces of measurement data constituting the candidate data set, i.e., four.

The sphere information generation section 81 obtains the four or more pieces of measurement data constituting the candidate data set as time-series data. In the case where the number of pieces of measurement data constituting the determination data set is less than the number of pieces of measurement data constituting the candidate data set, the determination section 82 may obtain the four or more pieces of measurement data constituting the determination data set by obtaining four or more pieces of measurement data sequentially during part of the period over which the sphere information generation section 81 obtains the candidate data set. Alternatively, the determination section 82 may obtain, at predetermined time intervals, some of pieces of time-series data obtained by the sphere information generation section 81, and use the obtained pieces of time-series data as the four or more pieces of measurement data constituting the determination data set.

The offset correction processing by the offset correction section 83 includes correcting an offset of the first to third detection signals Sx, Sy, and Sz to generate first to third corrected signals by using the first to third detection signals Sx, Sy, and Sz and the proper center coordinates stored and output by the sphere information generation section 81, and outputting the first to third corrected signals to the position information generation section 84.

The sphere information generation section 81 may store initial sphere information in advance. The initial sphere information includes data on initial values of the center coordinates and an initial value of the radius of the virtual sphere. For example, the data on the initial values of the center coordinates and the initial value of the radius are determined before shipment of an apparatus including the joint mechanism 300, on the basis of the configuration of the joint mechanism 300 to which the position detection device 1 is applied. The initial values of the center coordinates are also proper center coordinates.

The position information generation processing by the position information generation section 84 includes generating position information indicating the relative position of the magnetic field generator 2 with respect to the magnetic sensor device 4 on the basis of the first to third corrected signals.

Next, the second processing by the determination section 82 will be described concretely. The second processing includes determining that the candidate data set is unsuitable for use in the first processing if four or more measurement points corresponding to the four or more pieces of measurement data constituting the determination data set in the reference coordinate system satisfy a predetermined determination criterion indicating that the measurement points are located on a plane or distributed over and in close vicinity of a plane, and otherwise, determining that the candidate data set is suitable for use in the first processing.

In the present embodiment, the second processing includes processing for determining an approximate plane by using the least squares method. The approximate plane is a plane approximating the distribution of the four or more measurement points corresponding to the four or more pieces of measurement data constituting the determination data set in the reference coordinate system. With the value of the first detection signal Sx taken as a first variable x, the value of the second detection signal Sy as a second variable y, and the value of the third detection signal Sz as a third variable z, the approximate plane is expressed in, for example, Eq. (1) below:

$$z = a \cdot x + b \cdot y + c \qquad (1)$$

where a, b, and c are constants.

Now, N (N is an integer of 4 or more) measurement points will be referred to as first to Nth measurement points. An ith (i is an integer of 1 or more and not more than N) measurement point will be denoted as (Sxi, Syi, Szi). According to the least squares method, for example, a residual sum of squares RSS, i.e., the summation of squared residuals between the values of z obtained by substituting Sxi and Syi into x and y of Eq. (1) and Szi, is obtained. Then, a, b and c that minimize the residual sum of squares RSS are obtained to determine the approximate plane. The residual sum of squares RSS is computed in accordance with Eq. (2) below:

$$RSS = \Sigma(a \cdot Sxi + b \cdot Syi + c - Szi)^2 \qquad (2)$$

where $\Sigma$ represents summation for i from 1 to N.

The residual sum of squares RSS is small if the N measurement points are distributed over and in close vicinity of the approximate plane. In particular, if all the N measurement points are located on the approximate plane, the residual sum of squares RSS is 0. In the present embodiment, such a characteristic of the residual sum of squares RSS is used for the second processing to determine whether the candidate data set is suitable for use in the first processing. The determination criterion in the present embodiment is that the residual sum of squares RSS obtained in determining the approximate plane by using the least squares method as described above is less than or equal to a predetermined threshold TH1.

If the threshold TH1 is 0, the determination criterion indicates that the four or more measurement points corresponding to the four or more pieces of measurement data constituting the determination data set are located on a plane. If the threshold TH1 vis greater than 0, the determination criterion indicates that the four or more measurement points corresponding to the four or more pieces of measurement data constituting the determination data set are distributed over and in close vicinity of a plane.

The second processing includes determining that the candidate data set is unsuitable for use in the first processing if the residual sum of squares RSS is less than or equal to the threshold TH1, and otherwise, determining that the candidate data set is suitable for use in the first processing.

Examples of the threshold TH1 will now be described. The dimension of the residual sum of squares RSS is the square of length. The dimension of the threshold TH1 is thus also the square of length. If the sphere information generation section 81 stores the initial sphere information as described above, the threshold TH1 may be a value proportional to the square of the initial value of the radius of the virtual sphere, for example. The initial value of the radius of the virtual sphere will be denoted by the symbol $R_0$. For example, the threshold TH1 may be the product of the square of the initial value $R_0$, the number N of measurement points and a threshold adjustment value C1, i.e., $C1 \cdot N \cdot R_0^2$. Since the residual sum of squares RSS is greater than or equal to 0, the threshold TH1 needs to be greater than or equal to 0. Since N and $R_0^2$ are positive values, the threshold adjustment value C1 needs to be greater than or equal to 0.

A value RS S/N obtained by dividing the residual sum of squares RSS by the number N of the measurement points is an average of the squared residuals. If the threshold TH1 is $C1 \cdot N \cdot R_0^2$, the determination criterion indicates that the average RSS/N of the squared residuals is less than or equal to $C1 \cdot R_0^2$. The determination criterion in the present embodiment indicates that the average RSS/N of the squared residuals is sufficiently smaller than the square of the initial value $R_0$ of the radius.

The threshold adjustment value C1 is a value for adjusting the threshold TH1. The smaller the threshold adjustment value C1, the smaller the threshold TH1. The threshold adjustment value C1 is desirably smaller than 0.5, more desirably 0.2 or smaller. For example, if the threshold adjustment value C1 is 0, the threshold TH1 is 0 as well. In such a case, the candidate data set is determined to be unsuitable for use in the first processing only if all the four or more measurement points corresponding to the four or more pieces of measurement data constituting the determination data set are located on the approximate plane. In the case where the threshold adjustment value C1 is greater than 0 and sufficiently smaller than 1, the candidate data set is determined to be unsuitable for use in the first processing if the four or more measurement points corresponding to the four or more pieces of measurement data constituting the determination data set are distributed over and in close vicinity of the approximate plane.

The offset correction processing by the offset correction section 83 and the position information generation processing by the position information generation section 84 will now be described concretely. In the following description, the first corrected signal, the second corrected signal, and the third corrected signal will be denoted by the symbols CSx, CSy, and CSz, respectively. The center coordinates of the virtual sphere will be expressed as (cx, cy, cz).

As described above, the position of the magnetic field generator 2 in the reference coordinate system changes along the predetermined spherical surface, and the plurality of measurement points are distributed over the approximate spherical surface or near the approximate spherical surface. The center of the predetermined spherical surface coincides or almost coincides with the center of the first spherical surface, i.e., the reference position. Without an offset, the center coordinates (cx, cy, cz) of the virtual sphere having the approximate spherical surface therefore coincide or almost coincide with the reference position. However, if offsets occur, the center coordinates (cx, cy, cz) of the virtual sphere deviate from the reference position.

The point of origin of the reference coordinate system may be the reference position. In such a case, for example, the offset correction processing may be processing for converting a measurement point (Sx, Sy, Sz) into a point (Sx−cx, Sy−cy, Sz−cz) so that the center coordinates (cx, cy, cz) of the virtual sphere computed in the sphere information generation processing become the point of origin (0, 0, 0) of the reference coordinate system. Here, the first to third corrected signals CSx, CSy, and CSz are expressed in the following Eqs. (3) to (5), respectively.

$$CSx = Sx - cx \quad (3)$$

$$CSy = Sy - cy \quad (4)$$

$$CSz = Sz - cz \quad (5)$$

A point (CSx, CSy, CSz) in the reference coordinate system has a correspondence with the coordinates of the magnetic field generator 2 in the reference coordinate system. For example, the position information generation processing may be processing for determining the coordinates of the magnetic field generator 2 in the reference coordinate system by correcting the components of the point (CSx, CSy, CSz), i.e., the first to third corrected signals CSx, CSy, and CSz. The first to third corrected signals CSx, CSy, and CSz are corrected by, for example, multiplying the first to third corrected signals CSx, CSy, and CSz by respective predetermined correction coefficients so that the distance from the point of origin to the point (CSx, CSy, CSz) in the reference coordinate system becomes equal to the actual distance from the magnetic sensor device 4 to the magnetic field generator 2.

Figure 13:
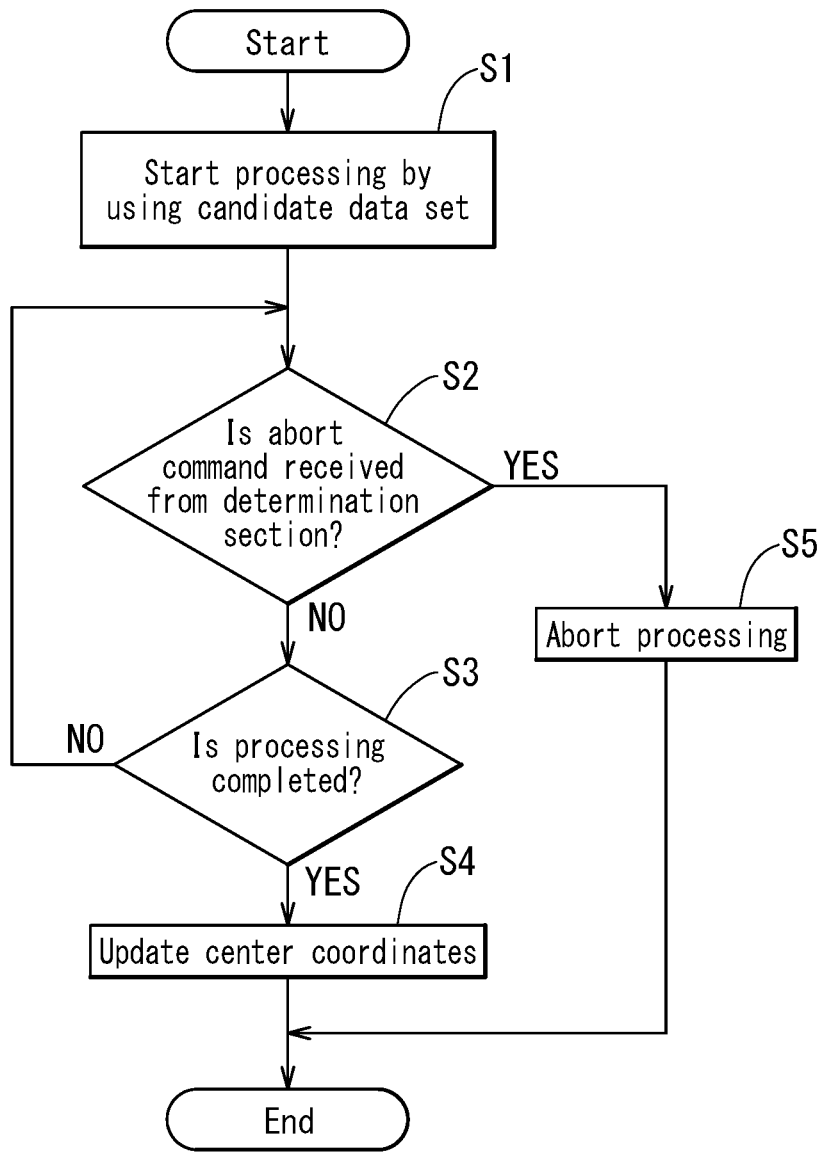
FIG. 13 is a flowchart illustrating first processing in the first embodiment of the invention.

Next, the first processing will be described with reference to FIG. 13. FIG. 13 is a flowchart illustrating the first processing. The first processing is repeated during use of the position detection device 1.

In the first processing, first, the sphere information generation section 81 starts the processing for determining the center coordinates of the virtual sphere by using the candidate data set obtained as described above (step S1).

The first processing then proceeds to checking whether an abort command is received from the determination section 82 (step S2). If it is confirmed in step S2 that no abort command is received (NO), the first processing then proceeds to determining whether the processing for determining the center coordinates of the virtual sphere is completed (step S3). If it is determined in step S3 that the processing is not completed (NO), the first processing returns to step S2.

If it is determined in step S3 that the processing is completed (YES), it follows that the candidate data set has been determined to be suitable for use in the first processing by the second processing and proper center coordinates have been obtained in the first processing. In such a case, the sphere information generation section 81 updates the stored proper center coordinates with the obtained center coordinates (step S4), and ends one round of the first processing.

If it is confirmed in step S2 that an abort command is received (YES), the sphere information generation section 81 aborts the processing for determining the center coordinates of the virtual sphere (step S5), and ends one round of the first processing.

Figure 14:
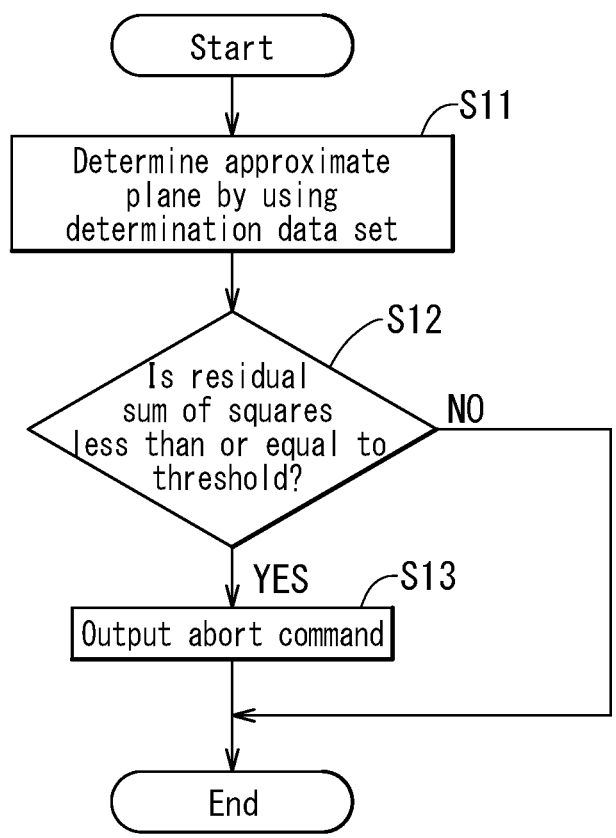
FIG. 14 is a flowchart illustrating second processing in the first embodiment of the invention.

Next, the second processing will be described with reference to FIG. 14. FIG. 14 is a flowchart illustrating the second processing. The second processing is repeated during use of the position detection device 1.

In the second processing, first, the determination section 82 performs the processing for determining an approximate plane by using the least squares method with the determination data set obtained as described above (step S11). The second processing then proceeds to determining whether the residual sum of squares RSS obtained in step S11 is less than or equal to the threshold TH1 (step S12). If the residual sum of squares RSS is determined to be less than or equal to the threshold TH1 (YES) in step S12, an abort command is output to the sphere information generation section 81 (step S13), and one round of the second processing is thus ended.

If it is determined in step S12 that the residual sum of squares RSS is not less than or equal to the threshold TH1 (NO), one round of the second processing is ended without outputting of an abort command. The next round of the second processing is started at the same time with the next round of the first processing.

The effects of the position detection device 1, the signal processing circuit 5 and the magnetic sensor system 3 according to the present embodiment will now be described.

If the four or more measurement points corresponding to the four or more pieces of measurement data constituting the candidate data set in the reference coordinate system are located on a plane, it is not possible to determine the center coordinates of the virtual sphere by using the four or more measurement points. If the four or more measurement points are distributed near a plane, the accuracy of the center coordinates of the virtual sphere determined by using the four or more measurement points can be low. Such a candidate data set is therefore not suitable for determining the center coordinates of the virtual sphere.

In the present embodiment, the signal processing circuit 5 performs the first processing for determining the center coordinates of the virtual sphere by using the candidate data set and the second processing for determining whether the candidate data set is suitable for use in the first processing by using the determination data set. According to the present embodiment, the signal processing circuit 5 can determine, by performing the second processing, whether the candidate data set given to the signal processing circuit 5 is suitable for use in the first processing for determining the center coordinates of the virtual sphere having the approximate spherical surface. The determination data set is a set of four or more pieces of measurement data that are all or part of the four or more pieces of measurement data constituting the candidate data set. If the candidate data set is determined to be unsuitable for use in the first processing by the second processing using the determination data set, the candidate data set can actually be unsuitable for determining the center coordinates of the virtual sphere.

In the first processing, the signal processing circuit 5 stores the proper center coordinates determined by using the candidate data set determined to be suitable for use in the first processing. The offset correction processing uses such proper center coordinates for offset correction. The present embodiment thus makes it possible to improve the reliability of the center coordinates of the virtual sphere used for offset correction, and consequently improve the reliability of the offset correction.

Second Embodiment

A second embodiment of the invention will now be described. In the present embodiment, the contents of the second processing by the determination section 82 are different from those in the first embodiment. The second processing in the present embodiment will be described concretely below.

Suppose here that a plurality of measurement points are projected on the XY plane, the YZ plane, and the XZ plane in the reference coordinate system. The measurement points projected on such planes will hereinafter be referred to as projection points. If the four or more measurement points corresponding to the four or more pieces of measurement data constituting the determination data set are located on a plane or distributed over and in close vicinity of a plane, four or more projection points corresponding to the four or more measurement points are likely to be distributed over and in close vicinity of a straight line on at least one of the XY plane, the YZ plane or the XZ plane. Conversely, if four or more projection points corresponding to the four or more measurement points are distributed over and in close vicinity of a straight line on at least one of the XY plane, the YZ plane or the XZ plane, the four or more measurement points corresponding to the four or more pieces of measurement data constituting the determination data set are likely to be located on a plane or distributed over and in close vicinity of a plane.

If the four or more projection points are distributed over and in close vicinity of a straight line on the XY plane, it means that the first and second detection signals Sx and Sy have a strong correlation with each other. Similarly, if the four or more projection points are distributed over and in close vicinity of a straight line on the YZ plane, it means that the second and third detection signals Sy and Sz have a strong correlation with each other. Similarly, if the four or more projection points are distributed over and in close vicinity of a straight line on the XZ plane, it means that the first and third detection signals Sx and Sz have a strong correlation with each other. Having a strong correlation specifically means that the correlation coefficient has an absolute value of 1 or close to 1.

Here, take the value of the first detection signal Sx as a first variable x, the value of the second detection signal Sy as a second variable y, and the value of the third detection signal Sz as a third variable z. A first correlation coefficient $r_{xy}$ between the first and second variables x and y is determined by Eq. (6) below:

$$r_{xy} = s_{xy}/(s_x \cdot s_y) \qquad (6)$$

where $s_{xy}$ is a covariance between the first and second variables x and y, $s_x$ is a standard deviation of the first variable x, and $s_y$ is a standard deviation of the second variable y.

A second correlation coefficient $r_{yz}$ between the second and third variables y and z is determined by Eq. (7) below:

$$r_{yz} = s_{yz}/(s_y \cdot s_z) \qquad (7)$$

where $s_{yz}$ is a covariance between the second and third variables y and z, and $s_z$ is a standard deviation of the third variable z.

A third correlation coefficient $r_{xz}$ between the first and third variables x and z is determined by Eq. (8) below:

$$r_{xz} = s_{xz}/(s_x \cdot s_z) \qquad (8)$$

where $s_{xz}$ is a covariance between the first and third variables x and z.

In the present embodiment, the first to third correlation coefficients $r_{xy}$, $r_{yz}$, and $r_{xz}$ are used in the second processing to determine whether the candidate data set is suitable for use in the first processing. Specifically, in the present embodiment, the second processing includes processing for determining the first to third correlation coefficients $r_{xy}$, $r_{yz}$, and $r_{xz}$. A determination criterion in the second processing is that at least one of the first, second or third correlation coefficient $r_{xy}$, $r_{yz}$, or $r_{xz}$ has an absolute value greater than or equal to a predetermined threshold TH2. If the absolute value of at least one of the first, second or third correlation coefficient $r_{xy}$, $r_{yz}$, or $r_{xz}$ is high, it follows that the four or more projection points corresponding to the four or more measurement points are distributed over and in close vicinity of a straight line on at least one of the XY, YZ, or XZ plane. Therefore, if the absolute value of at least one of the first, second or third correlation coefficient $r_{xy}$, $r_{yz}$, or $r_{xz}$ is high, the four or more measurement points corresponding to the four or more pieces of measurement data constituting the determination data set can be said to be located on a plane or distributed over and in close vicinity of a plane. Like the determination criterion in the first embodiment, the determination criterion in the present embodiment therefore indicates that the four or more measurement points corresponding to the four or more pieces of measurement data constituting the determination data set in the reference coordinate system are located on a plane or distributed over and in close vicinity of a plane.

The second processing includes determining that the candidate data set is unsuitable for use in the first processing if at least one of the first, second, or third correlation coefficient $r_{xy}$, $r_{yz}$, or $r_{xz}$ has an absolute value greater than or equal to the threshold TH2, and otherwise, determining that the candidate data set is suitable for use in the first processing.

The correlation coefficients have an absolute value of 0 or more and not more than 1. The threshold TH2 is less than or equal to 1. The threshold TH2 is desirably greater than 0.5, more desirably greater than or equal to 0.7. If the threshold TH2 is 1, the determination criterion indicates that the four or more projection points corresponding to the four or more measurement points are located on a straight line on at least one of the XY, YZ, or XZ plane, and the four or more measurement points are located on a plane. If the threshold TH2 is less than 1 and sufficiently greater than 0, the determination criterion indicates that the four or more measurement points are distributed over and in close vicinity of a plane.

Figure 15:
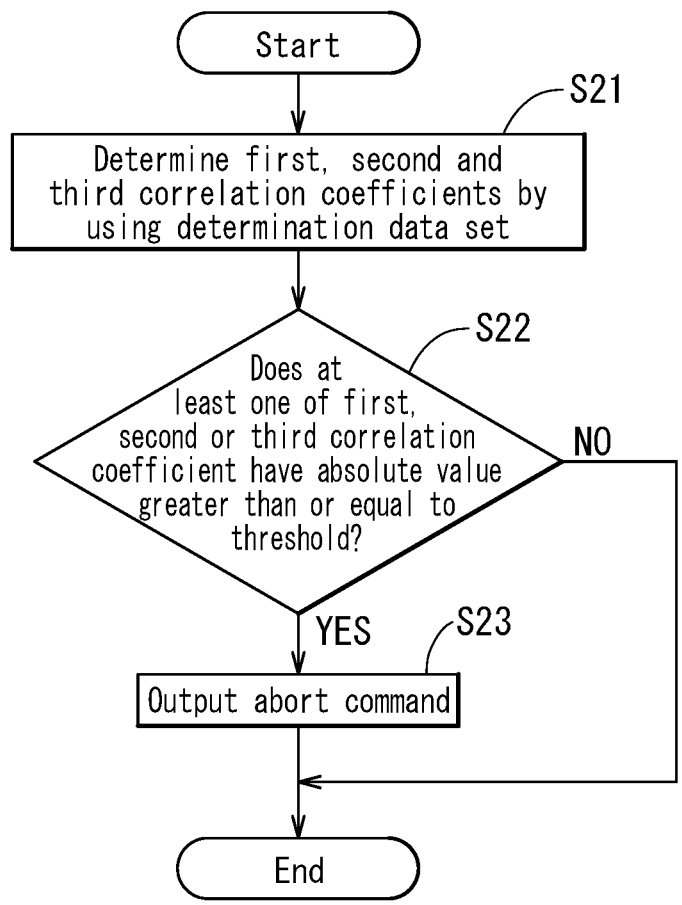
FIG. 15 is a flowchart illustrating second processing in a second embodiment of the invention.

Next, the second processing in the present embodiment will be described with reference to FIG. 15. FIG. 15 is a flowchart illustrating the second processing. The second processing is repeated during use of the position detection device 1.

In the second processing, first, the processing for determining the first to third correlation coefficients $r_{xy}$, $r_{yz}$, and $r_{xz}$ is performed by using the determination data set (step S21). The second processing then proceeds to determining whether at least one of the first, second, or third correlation coefficient $r_{xy}$, $r_{yz}$, or $r_{xz}$ obtained in step S21 has an absolute value greater than or equal to the threshold TH2 (step S22). If it is determined in step S22 that at least one of the first, second, or third correlation coefficient $r_{xy}$, $r_{yz}$, or $r_{xz}$ has an absolute value greater than or equal to the threshold TH2 (YES), an abort command is output to the sphere information generation section 81 (step S23), and one round of the second processing is thus ended. If it is determined in step S22 that none of the first to third correlation coefficients $r_{xy}$, $r_{yz}$, and $r_{xz}$ has an absolute value greater than or equal to the threshold TH2 (NO), one round of the second processing is ended without outputting of an abort command. The next round of the second processing is started at the same time with the next round of the first processing.

The configuration, function and effects of the present embodiment are otherwise the same as those of the first embodiment.

Third Embodiment

A third embodiment of the invention will now be described. In the present embodiment, the contents of the second processing by the determination section 82 are different from those in the first embodiment. The second processing in the present embodiment will be described concretely below.

In the present embodiment, the number of pieces of measurement data constituting the determination data set is four. Assume here a tetrahedron having the four measurement points corresponding to the four pieces of measurement data constituting the determination data set as its four vertexes in the reference coordinate system. If the four vertexes are distributed over and in close vicinity of a plane, the tetrahedron has a volume V of 0 or close to 0 in value. In particular, if the four vertexes are located on a plane, the volume V is 0.

In the present embodiment, the volume V of the tetrahedron is used in the second processing to determine whether the candidate data set is suitable for use in the first processing. Specifically, in the present embodiment, the second processing includes processing for determining the volume V of the tetrahedron. The determination criterion in the second processing is that the volume V of the tetrahedron is less than or equal to a predetermined threshold TH3. The second processing includes determining that the candidate data set is unsuitable for use in the first processing if the volume V of the tetrahedron is less than or equal to the threshold TH3, and otherwise, determining that the candidate data set is suitable for use in the first processing.

The four measurement points corresponding to the four pieces of measurement data constituting the determination data set will be denoted as (Sx1, Sy1, Sz1), (Sx2, Sy2, Sz2), (Sx3, Sy3, Sz3), and (Sx4, Sy4, Sz4). For the four measurement points, a determinant D expressed in the following Eq. (9) is defined.

$$D = \begin{vmatrix} Sx1-Sx4 & Sy1-Sy4 & Sz1-Sz4 \\ Sx2-Sx4 & Sy2-Sy4 & Sz2-Sz4 \\ Sx3-Sx4 & Sy3-Sy4 & Sz3-Sz4 \end{vmatrix} \quad (9)$$

The volume V of the tetrahedron having the four measurement points (Sx1, Sy1, Sz1), (Sx2, Sy2, Sz2), (Sx3, Sy3, Sz3), and (Sx4, Sy4, Sz4) as the four vertexes is computed in accordance with the following Eq. (10) using the determinant D.

$$V=|D|/6 \quad (10)$$

If the volume V of the tetrahedron is small, it follows that the four measurement points corresponding to the four pieces of measurement data constituting the determination data set are distributed over and in close vicinity of a plane. In particular, if the volume V of the tetrahedron is 0, it follows that the four measurement points corresponding to the four pieces of measurement data constituting the determination data set are located on a plane. The determination criterion in the present embodiment thus indicates that the four measurement points corresponding to the four pieces of measurement data constituting the determination data set in the reference coordinate system are located on a plane or distributed over and in close vicinity of a plane.

Examples of the threshold TH3 will now be described. The dimension of the volume V of the tetrahedron is the cube of length. The dimension of the threshold TH3 is thus also the cube of length. If the sphere information generation section 81 stores the initial sphere information as described above, the threshold TH3 may be, for example, a value proportional to the volume $V_0$ of a regular tetrahedron inscribed in the virtual sphere having an initial radius value $R_0$. For example, the threshold TH3 may be the product of the volume $V_0$ of the regular tetrahedron and a threshold adjustment value C3, i.e., $C3 \cdot V_0$.

The volume $V_0$ of the regular tetrahedron can be determined as described below by using the initial radius value $R_0$. The length $a_0$ of a side of the regular tetrahedron inscribed in the virtual sphere having the initial radius value $R_0$ is expressed in the following Eq. (11) using the initial radius value $R_0$.

$$a_0 = 2\sqrt{(6)} \cdot R_0/3 \quad (11)$$

The volume $V_0$ of the regular tetrahedron is expressed in the following Eq. (12) using the length $a_0$.

$$V_0 = \sqrt{(2)} \cdot a_0^3/12 \quad (12)$$

Substituting Eq. (11) into Eq. (12) yields Eq. (13) for determining the volume $V_0$ of the regular tetrahedron by using the initial radius value $R_0$.

$$V_0 = \sqrt{(2)} \cdot \left(2 \cdot \sqrt{(6)} \cdot R_0/3\right)^3/12 = 8 \cdot \sqrt{(3)} \cdot R_0^3/27 \quad (13)$$

The threshold adjustment value C3 is a value for adjusting the threshold TH3. The threshold adjustment value C3 is limited to a value of 0 or more and not more than 1. The smaller the threshold adjustment value C3, the smaller the threshold TH3. The threshold adjustment value C3 is desirably less than 0.5, more desirably less than or equal to 0.2. For example, if the threshold adjustment value C3 is 0, the threshold TH3 is 0 as well. In such a case, the candidate data set is determined to be unsuitable for use in the first processing only if all the four measurement points corresponding to the four pieces of measurement data constituting the determination data set are located on a plane. In the case where the threshold adjustment value C3 is greater than 0 and sufficiently smaller than 1 in value, the candidate data set is determined to be unsuitable for use in the first processing if the four measurement points corresponding to the four pieces of measurement data constituting the determination data set are distributed over and in close vicinity of the approximate plane.

Figure 16:
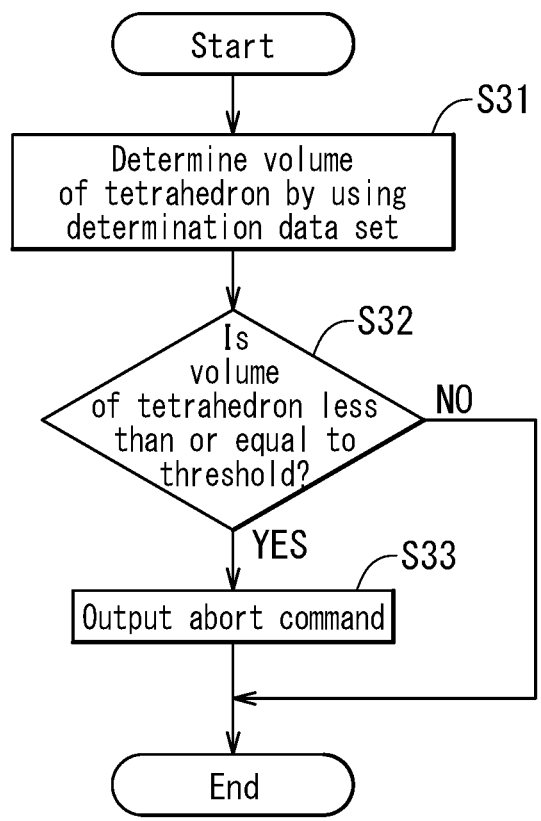
FIG. 16 is a flowchart illustrating second processing in a third embodiment of the invention.

Next, the second processing in the present embodiment will be described with reference to FIG. 16. FIG. 16 is a flowchart illustrating the second processing. The second processing is repeated during use of the position detection device 1.

In the second processing, first, the processing for determining the volume V of the regular tetrahedron is performed by using the determination data set (step S31). The second processing then proceeds to determining whether the volume V of the regular tetrahedron obtained in step S31 is less than or equal to the threshold TH3 (step S32). If the volume V of the regular tetrahedron is determined to be less than or equal to the threshold TH3 (YES) in step S32, an abort command is output to the sphere information generation section 81 (step S33), and one round of the second processing is thus ended. If it is determined in step S32 that the volume V of the regular tetrahedron is not less than or equal to the threshold TH3 (NO), one round of the second processing is ended without outputting of an abort command. The next round of the second processing is started at the same time with the next round of the first processing.

The configuration, function and effects of the present embodiment are otherwise the same as those of the first embodiment.

Fourth Embodiment

Figure 17:
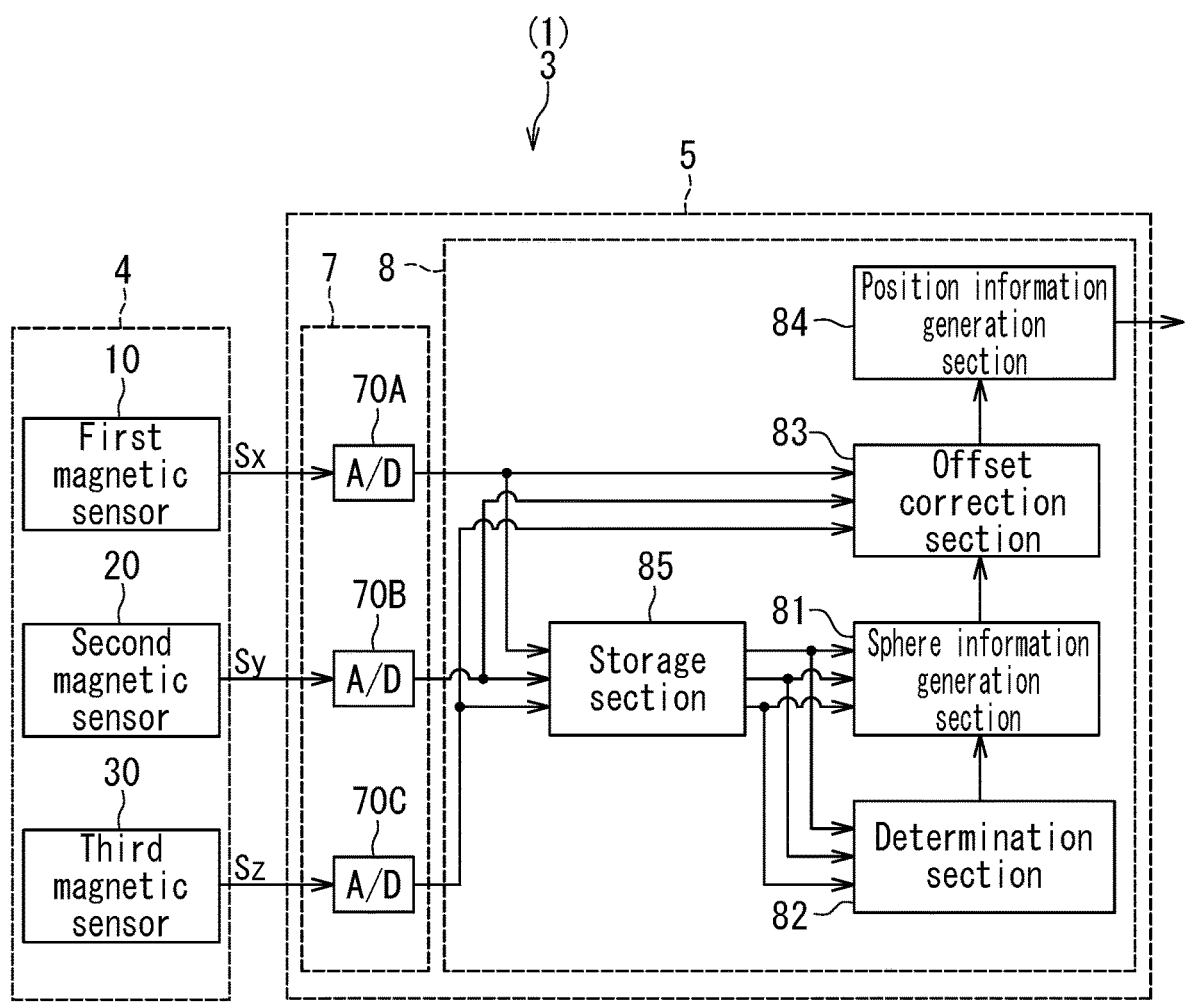
FIG. 17 is a functional block diagram illustrating a configuration of a magnetic sensor system according to a fourth embodiment of the invention.

A fourth embodiment of the invention will now be described. First, with reference to FIG. 17, a description will be given of differences of the signal processing circuit 5 according to the fourth embodiment from that according to the first embodiment. FIG. 17 is a functional block diagram illustrating a configuration of the magnetic sensor system 3 according to the present embodiment.

The second processor 8 of the signal processing circuit 5 according to the present embodiment includes a storage section 85 in addition to the sphere information generation section 81, the determination section 82, the offset correction section 83 and the position information generation section 84 described in relation to the first embodiment. In the present embodiment, the first to third detection signals Sx, Sy and Sz converted into digital form by the A/D converters 70A, 70B and 70C of the first processor 7 of the signal processing circuit 5 are input to the offset correction section 83 and the storage section 85.

The storage section 85 stores candidate data sets each being a set of four or more pieces of measurement data. In the present embodiment, the second processing by the determination section 82 includes obtaining the four or more pieces of measurement data constituting the determination data set from the storage section 85.

The contents of the second processing may be similar to those of the second processing in the first, second, or third embodiment.

In the present embodiment, the first processing by the sphere information generation section 81 is performed by using the candidate data set determined to be suitable for use in the first processing by the second processing. Specifically, the sphere information generation section 81 obtains a candidate data set stored in the storage section 85 and performs the first processing using the candidate data set only if the candidate data set stored in the storage section 85 is determined to be suitable for use in the first processing by the second processing.

Figure 18:
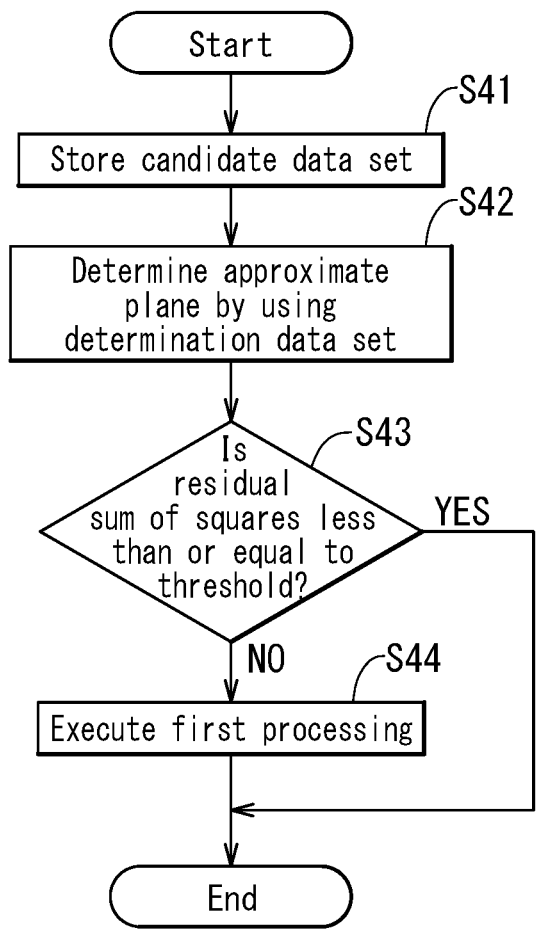
FIG. 18 is a flowchart illustrating the operation of a second processor of the fourth embodiment of the invention.

Next, an operation of the second processor 8 related to the first and second processing will be described with reference to FIG. 18. FIG. 18 is a flowchart illustrating the operation of the second processor 8. The operation illustrated in FIG. 18 is repeated during use of the position detection device 1. By way of example, the description here deals with a case where the contents of the second processing are similar to those of the second processing in the first embodiment.

In the operation illustrated in FIG. 18, first, the storage section 85 stores a candidate data set (step S41). Next, the determination section 82 obtains a determination data set from the storage section 85 as described above, and performs the processing for determining an approximate plane by the least squares method using the obtained determination data set (step S42). Next, the determination section 82 determines whether the residual sum of squares RSS obtained in step S42 is less than or equal to the threshold TH1 (step S43). If it is determined in step S43 that the residual sum of squares RSS is not less than or equal to the threshold TH1 (NO), the sphere information generation section 81 obtains the candidate data set from the storage section 85, executes the first processing by using the obtained candidate data set (step S44), and ends one round of operation. If it is determined in step S43 that the residual sum of squares RSS is less than or equal to the threshold TH1 (YES), one round of operation is ended without execution of the first processing.

In the operation illustrated in FIG. 18, steps S42 and S43 correspond to the second processing. In the case where the contents of the second processing in the present embodiment are similar to those of the second processing in the second embodiment, the determination section 82 executes a first step and a second step in order after the execution of step S41 illustrated in FIG. 18. In the first step, the first to third correlation coefficients $r_{xy}$, $r_{yz}$, and $r_{xz}$ are determined by using the determination data set. In the second step, it is determined whether at least one of the first, second, or third correlation coefficient $r_{xy}$, $r_{yz}$, or $r_{xz}$ obtained in the first step has an absolute value greater than or equal to the threshold TH2. If it is determined in the second step that none of the first to third correlation coefficients $r_{xy}$, $r_{yz}$, and $r_{xz}$ has an absolute value greater than or equal to the threshold TH2, step S44 illustrated in FIG. 18 is executed, and one round of operation is thus ended. If it is determined in the second step that at least one of the first, second, or third correlation coefficient $r_{xy}$, $r_{yz}$, or $r_{xz}$ has an absolute value greater than or equal to the threshold TH2, one round of operation is ended without execution of the first processing.

In the case where the contents of the second processing in the present embodiment are similar to those of the second processing in the third embodiment, the determination section 82 executes a third step and a fourth step in order after the execution of step S41 illustrated in FIG. 18. In the third step, the volume V of the tetrahedron is determined by using the determination data set. In the fourth step, it is determined whether the volume V of the tetrahedron obtained in the third step is less than or equal to the threshold TH3. If it is determined in the fourth step that the volume V of the tetrahedron is not less than or equal to the threshold TH3, step S44 illustrated in FIG. 18 is executed, and one round of operation is thus ended. If it is determined in the fourth step that the volume V of the tetrahedron is less than or equal to the threshold TH3, one round of operation is ended without execution of the first processing.

The configuration, function and effects of the present embodiment are otherwise the same as those of any of the first to third embodiments.

The present invention is not limited to the foregoing embodiments, and various modifications may be made thereto. For example, the signal processing circuit and the magnetic sensor system of the present invention are applicable not only to detection of the relative position of the magnetic field generator with respect to the magnetic sensor device but also to detection of the orientation of the magnetic sensor device configured to be rotatable in a predetermined magnetic field.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A signal processing circuit for processing a first detection signal, a second detection signal, and a third detection signal that have correspondences with components in three mutually different directions of a magnetic field at a reference position, the first to third detection signals being output from a magnetic sensor device that generates the first to third detection signals,
    the signal processing circuit performing first processing and second processing, with a set of values of the first to third detection signals at a certain timing being taken as measurement data and with coordinates that represent the measurement data in an orthogonal coordinate system that is defined by three axes for expressing the values of the first to third detection signals being taken as a measurement point,
    the first processing including determining center coordinates of a virtual sphere having a spherical surface approximating a distribution of a plurality of measurement points at a plurality of timings by using four or more pieces of measurement data obtained at respective different timings, and
    the second processing including:
        determining whether a candidate data set is suitable for use in the first processing by using a determination data set, where the candidate data set is a set of four or more pieces of measurement data serving as candidates for the measurement data for use in the first processing, and the determination data set is a set of four or more pieces of measurement data that are all or part of the four or more pieces of measurement data constituting the candidate data set, and
        processing for determining a first correlation coefficient between a first variable and a second variable, a second correlation coefficient between the second variable and a third variable, and a third correlation coefficient between the first variable and the third variable in the four or more pieces of measurement data constituting the determination data set, where the first variable is a value of the first detection signal, the second variable is a value of the second detection signal, and the third variable is a value of the third detection signal,
    wherein the determining of whether the candidate data set is suitable for use in the first processing includes determining that the candidate data set is unsuitable for use in the first processing if four or more measurement points corresponding to the four or more pieces of measurement data constituting the determination data set in the orthogonal coordinate system satisfy a predetermined determination criterion indicating that the four or more measurement points are located on a plane or distributed over and in close vicinity of a plane, and otherwise, determining that the candidate data set is suitable for use in the first processing, and
    the predetermined determination criterion is that at least one of the first, second or third correlation coefficient has an absolute value greater than or equal to a predetermined threshold.

2. The signal processing circuit according to claim 1, further performing offset correction processing, the offset correction processing including correcting an offset of the first to third detection signals to generate first to third corrected signals by using the first to third detection signals and the center coordinates obtained by the first processing.

3. The signal processing circuit according to claim 1, wherein
    the second processing is performed in parallel with the first processing using the candidate data set, and
    the first processing including outputting the determined center coordinates as proper center coordinates only if the candidate data set is determined to be suitable for use in the first processing by the second processing.

4. The signal processing circuit according to claim 1, wherein the first processing is performed by using the candidate data set determined to be suitable for use in the first processing by the second processing.

5. The signal processing circuit according to claim 1, wherein number of pieces of measurement data constituting the candidate data set is five or more, and number of pieces of measurement data constituting the determination data set is less than the number of pieces of measurement data constituting the candidate data set.

6. The signal processing circuit according to claim 1, wherein number of pieces of measurement data constituting the determination data set is equal to number of pieces of measurement data constituting the candidate data set.

7. A position detection device comprising:
    a magnetic field generator that generates a predetermined magnetic field;
    a magnetic sensor device; and
    the signal processing circuit of claim 1, wherein
    the magnetic field generator is able to change its relative position with respect to the magnetic sensor device along a predetermined spherical surface, and
    the magnetic sensor device generates the first to third detection signals.

8. A magnetic sensor system comprising:
    a magnetic sensor device; and
    the signal processing circuit of claim 1,
    wherein the magnetic sensor device includes a first magnetic sensor for generating the first detection signal, a second magnetic sensor for generating the second detection signal, and a third magnetic sensor for generating the third detection signal.

\* \* \* \* \*